United States Patent
Hatano et al.

(10) Patent No.: US 9,117,916 B2
(45) Date of Patent: Aug. 25, 2015

(54) SEMICONDUCTOR DEVICE COMPRISING OXIDE SEMICONDUCTOR FILM

(71) Applicant: Semiconductor Energy Laboratory Co., Ltd., Atsugi-shi, Kanagawa-ken (JP)

(72) Inventors: Takehisa Hatano, Atsugi (JP); Sachiaki Tezuka, Atsugi (JP); Atsuo Isobe, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/646,086

(22) Filed: Oct. 5, 2012

(65) Prior Publication Data

US 2013/0092943 A1  Apr. 18, 2013

(30) Foreign Application Priority Data

Oct. 13, 2011 (JP) ................. 2011-226229

(51) Int. Cl.
*H01L 29/10* (2006.01)
*H01L 29/12* (2006.01)
(Continued)

(52) U.S. Cl.
CPC ........ *H01L 29/7869* (2013.01); *H01L 27/1156* (2013.01); *H01L 27/1225* (2013.01); *H01L 29/42384* (2013.01)

(58) Field of Classification Search
CPC ............ H01L 29/78648; H01L 29/786; H01L 29/78603; H01L 29/4908; H01L 29/78678; H01L 29/7869; H01L 29/3262; H01L 29/78675; H01L 29/78621; H01L 27/3276; H01L 27/3297; H01L 27/3279; H01L 27/3244; H01L 27/3248; H01L 27/326; H01L 27/32

USPC .......... 257/43, 59, 72, 300, 60, 83, 290, 257, 257/40, 42, 292; 438/151, 104, 22, 26, 28, 438/34, 42, 46

See application file for complete search history.

(56) References Cited

U.S. PATENT DOCUMENTS 5,112,765 A   5/1992  Cederbaum et al.
5,731,856 A   3/1998  Kim et al.
(Continued)

FOREIGN PATENT DOCUMENTS

EP   1737044 A   12/2006
EP   2226847 A   9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters ) , Sep. 27, 2004, vol. 85, No. 13, pp. 2541-2543.
(Continued)

*Primary Examiner* — Thanh Y Tran
(74) *Attorney, Agent, or Firm* — Eric J. Robinson; Robinson Intellectual Property Law Office, P.C.

(57) ABSTRACT

A semiconductor device which is miniaturized while favorable characteristics thereof are maintained is provided. In addition, the miniaturized semiconductor device is provided with a high yield. The semiconductor device has a structure including an oxide semiconductor film provided over a substrate having an insulating surface; a source electrode layer and a drain electrode layer which are provided in contact with side surfaces of the oxide semiconductor film and have a thickness larger than that of the oxide semiconductor film; a gate insulating film provided over the oxide semiconductor film, the source electrode layer, and the drain electrode layer; and a gate electrode layer provided in a depressed portion formed by a step between a top surface of the oxide semiconductor film and top surfaces of the source electrode layer and the drain electrode layer.

19 Claims, 11 Drawing Sheets

(51) Int. Cl.
  *H01L 29/786* (2006.01)
  *H01L 27/115* (2006.01)
  *H01L 27/12* (2006.01)
  *H01L 29/423* (2006.01)

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,620,659 B2 | 9/2003 | Emmma et al. | |
| 6,717,180 B2 | 4/2004 | Yamazaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,354,674 B2 | 1/2013 | Kimura | |
| 8,482,001 B2* | 7/2013 | Yamazaki et al. | 257/43 |
| 8,643,008 B2 | 2/2014 | Yamazaki et al. | |
| 8,680,679 B2* | 3/2014 | Godo et al. | 257/749 |
| 8,772,769 B2 | 7/2014 | Yamazaki | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1* | 9/2008 | Park et al. | 257/43 |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0078970 A1 | 3/2009 | Yamazaki et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0032668 A1* | 2/2010 | Yamazaki et al. | 257/43 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0089414 A1 | 4/2011 | Yamazaki et al. | |
| 2011/0089417 A1 | 4/2011 | Yamazaki et al. | |
| 2011/0101332 A1* | 5/2011 | Yamazaki et al. | 257/43 |
| 2011/0121286 A1* | 5/2011 | Yamazaki et al. | 257/43 |
| 2011/0133177 A1* | 6/2011 | Suzawa et al. | 257/43 |
| 2011/0140099 A1* | 6/2011 | Yamazaki | 257/43 |
| 2011/0175087 A1* | 7/2011 | Yamazaki et al. | 257/57 |
| 2011/0193080 A1 | 8/2011 | Yamazaki et al. | |
| 2011/0210326 A1 | 9/2011 | Suzawa et al. | |
| 2011/0215317 A1* | 9/2011 | Yamazaki et al. | 257/43 |
| 2011/0215331 A1* | 9/2011 | Yamazaki et al. | 257/60 |
| 2011/0278571 A1* | 11/2011 | Yamazaki et al. | 257/57 |
| 2011/0297928 A1* | 12/2011 | Isobe et al. | 257/43 |
| 2011/0303913 A1* | 12/2011 | Yamazaki et al. | 257/43 |
| 2012/0012845 A1* | 1/2012 | Kato et al. | 257/57 |
| 2012/0178224 A1 | 7/2012 | Yamazaki | |
| 2012/0187396 A1 | 7/2012 | Yamazaki et al. | |
| 2012/0187397 A1 | 7/2012 | Yamazaki et al. | |
| 2012/0187410 A1 | 7/2012 | Yamazaki et al. | |
| 2012/0187417 A1 | 7/2012 | Yamazaki et al. | |
| 2012/0187475 A1 | 7/2012 | Yamazaki et al. | |
| 2012/0228606 A1 | 9/2012 | Koezuka et al. | |
| 2013/0011961 A1* | 1/2013 | Ishizuka et al. | 438/104 |
| 2013/0087790 A1 | 4/2013 | Yamazaki | |
| 2013/0092940 A1 | 4/2013 | Tezuka et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |

(56) References Cited

FOREIGN PATENT DOCUMENTS

| | | |
|---|---|---|
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters ) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters ) , Jun. 17, 1996, vol. 68, No. 25, pp. 3650-3652.

Nakamura.M et al., "The phase relations in the $In_2O_3$—$Ga_2ZnO_4$—$ZnO$ system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—$ZnO$ System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics ) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters ) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics ) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters ) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters ) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters ) , Sep. 1, 2003, vol. 83, No. 9, pp. 1755-1757.

\* cited by examiner 100 102 104

106

108 110

112

SEMICONDUCTOR DEVICE COMPRISING OXIDE SEMICONDUCTOR FILM

BACKGROUND OF THE INVENTION

1. Field of the Invention

The disclosed invention relates to a semiconductor device and a method for manufacturing the semiconductor device.

In this specification and the like, a semiconductor device refers to all types of devices which can function by utilizing semiconductor characteristics; an electro-optical device, a light-emitting display device, a semiconductor circuit, and an electronic device are all semiconductor devices.

2. Description of the Related Art

Attention has been focused on a technique of manufacturing a transistor with the use of a semiconductor thin film formed over a substrate having an insulating surface. The transistor is applied to a wide range of semiconductor electronic devices such as an integrated circuit (IC) and an image display device (also simply referred to as display device). A silicon-based semiconductor material is widely known as a material for a semiconductor thin film applicable to a transistor. As another material, an oxide semiconductor material has been attracting attention.

For example, Patent Document 1 and Patent Document 2 disclose a technique of manufacturing a transistor with the use of zinc oxide or an In—Ga—Zn-based oxide as an oxide semiconductor and using the transistor as a switching element of a pixel or the like of a display device.

REFERENCE

[Patent Document 1] Japanese Published Patent Application No. 2007-123861

[Patent Document 2] Japanese Published Patent Application No. 2007-096055

SUMMARY OF THE INVENTION

For high-speed operation, low power consumption, high integration, or the like of a transistor, it is necessary to miniaturize a transistor. In addition, in order to prevent a decrease in the on-state current of a transistor, a region of an oxide semiconductor film which does not overlap with a gate electrode layer (i.e., Loff region) needs to be as small as possible.

However, as a transistor is miniaturized, patterning accuracy, in particular, alignment accuracy becomes a problem, which inhibits the miniaturization of the transistor. Specifically, the alignment accuracy of a semiconductor film with a narrow line width and a gate electrode layer with a narrow line width greatly affects the deterioration in the shape and characteristics of a transistor, a decrease in a yield, and the like.

In view of the above, an object of one embodiment of the present invention is to provide a semiconductor device which is miniaturized while favorable characteristics thereof are maintained. In addition, an object of one embodiment of the present invention is to provide a miniaturized semiconductor device with a high yield.

A semiconductor device according to one embodiment of the present invention has a structure including an oxide semiconductor film provided over a substrate having an insulating surface; a source electrode layer formed in contact with a side surface of the oxide semiconductor film to have a thickness larger than that of the oxide semiconductor film; a drain electrode layer formed in contact with a side surface of the oxide semiconductor film facing the side surface to have a thickness larger than that of the oxide semiconductor film; a gate insulating film formed on a top surface of the oxide semiconductor film and side surfaces of the source electrode layer and the drain electrode layer, which are on the oxide semiconductor film side; and a gate electrode layer formed over the oxide semiconductor film to be embedded in the source electrode layer and the drain electrode layer with the gate insulating film provided therebetween.

In the semiconductor device according to one embodiment of the present invention, the gate insulating film and the gate electrode layer are formed in a depressed portion formed by a step between the top surface of the oxide semiconductor film and top surfaces of the source electrode layer and the drain electrode layer. The thickness of the gate insulating film (greater than or equal to 1 nm and less than or equal to 20 nm) determines a region of the oxide semiconductor film which does not overlap with the gate electrode layer (i.e., Loff region). The Loff region exists in the oxide semiconductor film. When a transistor is in an on state, the same electric field due to the gate electrode layer as that applied to a channel formation region is applied to the Loff region; thus, the resistance of the Loff region can be sufficiently lowered when the transistor is in an on state. Consequently, a decrease in the on-state current of the transistor can be suppressed.

The formation of the Loff region depends on the thickness of the gate insulating film (greater than or equal to 1 nm and less than or equal to 20 nm); therefore, the Loff region can be formed in a self-aligned manner without precise alignment.

In the above structure, the thickness of the source electrode layer and the drain electrode layer is preferably greater than or equal to 10 nm and less than or equal to 200 nm and the thickness of the oxide semiconductor film is preferably greater than or equal to 3 nm and less than or equal to 30 nm.

In one embodiment of the present invention, the oxide semiconductor film is formed over the substrate having an insulating surface, an insulating film is formed over the oxide semiconductor film, a mask is formed over the oxide semiconductor film and the insulating film, and the oxide semiconductor film and the insulating film are etched with the use of the mask; thus, an island-shaped oxide semiconductor film and an island-shaped insulating film are formed. Next, a first conductive film is formed over the island-shaped oxide semiconductor film and the island-shaped insulating film, and polishing (cutting or grinding) treatment is performed on the first conductive film so that the island-shaped insulating film is exposed; thus, the source electrode layer and the drain electrode layer which are in contact with the side surfaces of the oxide semiconductor film are formed. Moreover, the island-shaped insulating film is removed, the gate insulating film is formed over the island-shaped oxide semiconductor film, the source electrode layer, and the drain electrode layer, and then a second conductive film is formed over the gate insulating film and polishing treatment is performed on the second conductive film so that part of the gate insulating film is exposed; thus, the gate electrode layer is formed in a region overlapping with the oxide semiconductor film.

In one embodiment of the present invention, since the island-shaped insulating film is stacked over the island-shaped oxide semiconductor film, a step is formed between a surface of the substrate having an insulating surface and a top surface of the island-shaped insulating film. By performing polishing treatment on the first conductive film formed over the substrate and the island-shaped insulating film with the use of this step, the source electrode layer and the drain electrode layer can be formed. Thus, the source electrode layer and the drain electrode layer which are in contact with the side surfaces of the oxide semiconductor film can be formed in a self-aligned manner, which results in an improvement in the location accuracy of the oxide semiconductor film and the source and drain electrode layers.

In one embodiment of the present invention, since the source and drain electrode layers have a thickness larger than that of the oxide semiconductor film, a step is formed between the top surface of the oxide semiconductor film and the top surfaces of the source and drain electrode layers. By performing polishing treatment on the second conductive film formed over the gate insulating film with the use of this step, the gate electrode layer can be formed. Thus, the gate electrode layer provided in the region overlapping with the oxide semiconductor film can be formed in a self-aligned manner, which results in an improvement in the location accuracy of the oxide semiconductor film and the gate electrode layer.

As described above, the source and drain electrode layers and the gate electrode layer can be formed in a self-aligned manner in one embodiment of the present invention. Consequently, even a miniaturized semiconductor device can be manufactured with a high yield.

In one embodiment of the present invention, it is preferable that the mask for etching the oxide semiconductor film and the insulating film be subjected to a slimming process so that the mask is miniaturized to have a line width less than or equal to the limit of the resolution of a light exposure apparatus, preferably less than or equal to half of the limit of the resolution of the light exposure apparatus, more preferably less than or equal to one third of the limit of the resolution of the light exposure apparatus. For example, the line width can be greater than or equal to 30 nm and less than or equal to 2000 nm, preferably greater than or equal to 50 nm and less than or equal to 350 nm. Thus, a transistor can be further miniaturized.

In one embodiment of the present invention, polishing treatment is performed on the first conductive film with the use of the island-shaped insulating film formed over the island-shaped oxide semiconductor film as a hard mask; therefore, the oxide semiconductor film can be prevented from being shaved at the time of the polishing treatment.

In one embodiment of the present invention, chemical mechanical polishing (CMP) treatment is preferably used as polishing (cutting or grinding) treatment, for example.

According to one embodiment of the present invention, the gate electrode layer provided in the region overlapping with the oxide semiconductor film can be formed in a self-aligned manner; therefore, the location accuracy of the oxide semiconductor film and the gate electrode layer can be improved. Thus, deterioration in the shape and characteristics of a transistor can be prevented.

According to one embodiment of the present invention, a region of the oxide semiconductor film which does not overlap with the gate electrode layer (i.e., Loff region) can be formed as small as possible. Thus, a decrease in the on-state current of a transistor can be suppressed.

Therefore, a semiconductor device which is miniaturized while favorable characteristics thereof are maintained can be provided according to one embodiment of the present invention. In addition, such a miniaturized semiconductor device can be provided with a high yield.

DETAILED DESCRIPTION OF THE INVENTION

Figure 1A:
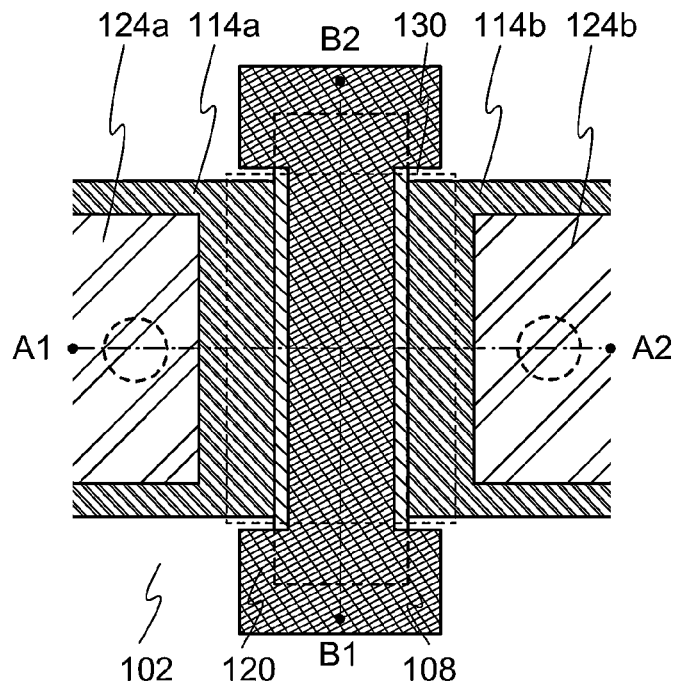
FIGS. 1A to 1C are a plan view and cross-sectional views of one embodiment of a semiconductor device.

Embodiments of the invention disclosed in this specification and the like are described in detail below with reference to drawings. However, the present invention is not limited to the description below and it is easily understood by those skilled in the art that the mode and details can be changed variously. Therefore, the present invention should not be construed as being limited to the content of the embodiments below. Note that in structures of the present invention described below, like portions or portions having similar functions are denoted by the same reference numerals in different drawings, and description thereof is not repeated. Further, the same hatching pattern is applied to portions having similar functions, and the portions are not especially denoted by reference numerals in some cases.

Note that the ordinal numbers such as "first" and "second" in this specification and the like are used for convenience and do not denote the order of steps or the stacking order of layers. In addition, the ordinal numbers in this specification do not denote particular names which specify the present invention.

Embodiment 1

In this embodiment, a semiconductor device and a method for manufacturing the semiconductor device according to one embodiment of the present invention are described with reference to FIGS. 1A to 1C, FIGS. 2A to 2E, and FIGS. 3A to 3E.

<Example of Structure of Semiconductor Device>

Figure 1B:
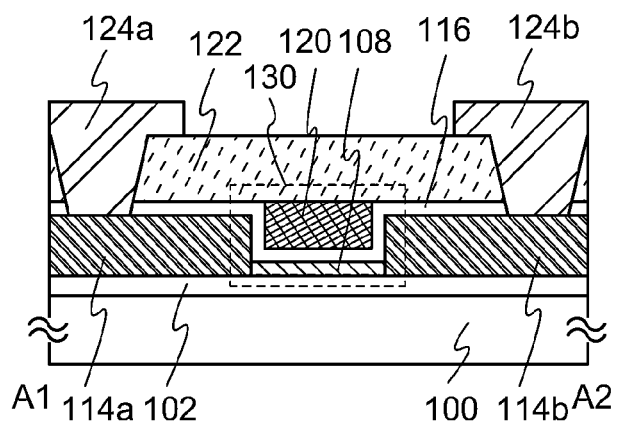
Figure 1C:
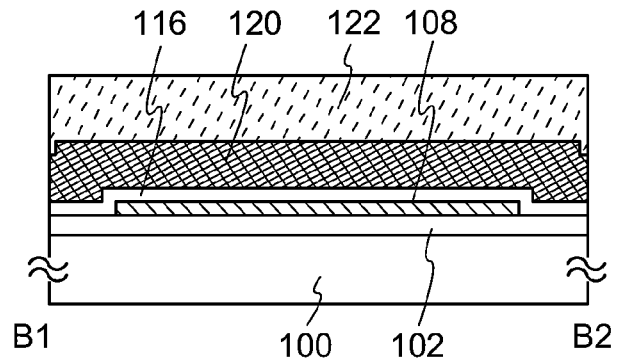

As an example of a semiconductor device, a plan view and cross-sectional views of a transistor 130 are illustrated in FIGS. 1A to 1C. FIG. 1A is a plan view of the transistor 130. FIG. 1B is a cross-sectional view taken along a line A1-A2 in FIG. 1A. FIG. 1C is a cross-sectional view taken along a line B1-B2 in FIG. 1A. Note that in FIG. 1A, some components of the transistor 130 (e.g., a gate insulating film 116 and an insulating film 122) are not illustrated for simplicity.

The transistor 130 illustrated in FIGS. 1A to 1C includes an oxide semiconductor film 108 provided over a substrate 100 having an insulating surface; a source electrode layer 114a and a drain electrode layer 114b which are provided in contact with side surfaces of the oxide semiconductor film 108; the gate insulating film 116 provided over the oxide semiconductor film 108, the source electrode layer 114a, and the drain electrode layer 114b; and a gate electrode layer 120 provided in a region overlapping with the oxide semiconductor film 108 with the gate insulating film 116 provided therebetween.

The insulating film 122 is provided over the transistor 130. A wiring layer 124a is provided in contact with the source electrode layer 114a through an opening provided in the insulating film 122. A wiring layer 124b is provided in contact with the drain electrode layer 114b through an opening provided in the insulating film 122. In addition, a base insulating film 102 may be provided between the substrate 100 and the oxide semiconductor film 108.

Here, the gate electrode layer 120 is provided in a depressed portion formed by a step between a top surface of the oxide semiconductor film 108 and top surfaces of the source electrode layer 114a and the drain electrode layer 114b. The thickness of the gate insulating film 116 (greater than or equal to 1 nm and less than or equal to 20 nm) determines a region of the oxide semiconductor film 108 which does not overlap with the gate electrode layer 120 (i.e., Loff region). Although the Loff region exists in the oxide semiconductor film 108, the thickness thereof is the same as that of the gate insulating film 116 and thus is sufficiently small. When a transistor 130 is in an on state, the same electric field due to the gate electrode layer 120 as that applied to a channel formation region is applied to the Loff region; thus, the resistance of the Loff region can be sufficiently lowered when the transistor 130 is in an on state. Consequently, a decrease in the on-state current of the transistor 130 can be suppressed.

The formation of the Loff region depends on the thickness of the gate insulating film 116 (greater than or equal to 1 nm and less than or equal to 20 nm); therefore, the Loff region can be formed in a self-aligned manner without precise alignment.

The thickness of the source electrode layer 114a and the drain electrode layer 114b is preferably greater than or equal to 10 nm and less than or equal to 200 nm. The thickness of the oxide semiconductor film 108 is preferably greater than or equal to 3 nm and less than or equal to 30 nm.

The oxide semiconductor film 108 is in a single crystal state, a polycrystalline (also referred to as polycrystal) state, an amorphous state, or the like.

An oxide semiconductor in an amorphous state can have a flat surface with relative ease; therefore, when a transistor including the oxide semiconductor is operated, interface scattering of carriers (electrons) can be reduced, and relatively high field-effect mobility can be obtained with relative ease.

In an oxide semiconductor having crystallinity, defects in the bulk can be further reduced and when the surface flatness of the oxide semiconductor is improved, field-effect mobility of a transistor including the oxide semiconductor which has crystallinity can be higher than that of a transistor including an oxide semiconductor in an amorphous state.

As the oxide semiconductor film 108, a c-axis aligned crystalline oxide semiconductor (CAAC-OS) film can be used.

The CAAC-OS film is not completely single crystal nor completely amorphous. The CAAC-OS film is an oxide semiconductor film with a crystal-amorphous mixed phase structure where crystal parts are included in an amorphous phase. Note that, in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a decrease in electron mobility, due to the grain boundary, is suppressed.

In each of the crystal parts included in the CAAC-OS film, the c-axis is aligned in a direction perpendicular to a surface where the CAAC-OS film is formed or a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification and the like, a simple term "perpendicular" includes a range from 85≤ to 95≤.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases.

Since the c-axes of the crystal parts included in the CAAC-OS film are aligned in the direction perpendicular to the surface where the CAAC-OS film is formed or a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction perpendicular to the surface where the CAAC-OS film is formed or the surface of the CAAC-OS film. The crystal part is formed by deposition or by performing treatment for crystallization such as heat treatment after deposition.

With the use of the CAAC-OS film in a transistor, a change in electric characteristics of the transistor due to irradiation with visible light or ultraviolet light can be suppressed. Thus, the transistor has high reliability.

The oxide semiconductor film 108 is preferably an oxide semiconductor which is highly purified by reducing impurities serving as electron donors (donors), such as hydrogen or water, and by reducing oxygen vacancies. The oxide semiconductor which is highly purified is an i-type (intrinsic) semiconductor or a substantially i-type semiconductor. Therefore, a transistor including the oxide semiconductor has significantly small off-state current. Further, the band gap of the oxide semiconductor is more than or equal to 2 eV, preferably more than or equal to 2.5 eV, more preferably more than or equal to 3 eV. With the use of an oxide semiconductor film which is highly purified by a sufficient decrease in the concentration of impurities such as moisture or hydrogen and a reduction of oxygen vacancies, the off-state current of a transistor can be decreased.

Specifically, various experiments can prove the small off-state current of a transistor in which a highly-purified oxide semiconductor is used for a semiconductor film. For example, even with an element with a channel width of $1/10^6$ $\Sigma$m and a channel length of 10 $\Sigma$m, in a range of from 1 V to 10 V of voltage (drain voltage) between a source terminal and a drain terminal, off-state current can be less than or equal to the measurement limit of a semiconductor parameter analyzer, that is, less than or equal to $1/10^{a13}$ A. In this case, it can be found that an off-state current density corresponding to a value obtained by dividing the off-state current by the channel width of the transistor is less than or equal to 100 zAa$\Sigma$m. In addition, a capacitor and a transistor were connected to each other and an off-state current density was measured by using a circuit in which a charge flowing into or from the capacitor was controlled by the transistor. In the measurement, the highly-purified oxide semiconductor film was used as a channel formation region in the transistor, and the off-state current density of the transistor was measured from a change in the amount of charge of the capacitor per unit time. As a result, it is found that, in the case where the voltage between the source terminal and the drain terminal of the transistor is 3 V, a smaller off-state current density of several tens of yoctoamperes per micrometer (yA/mm) can be obtained. Consequently, the transistor in which a highly purified oxide semiconductor film is used for a channel formation region has much smaller off-state current than a transistor including crystalline silicon.

Unless otherwise specified, in the case of an n-channel transistor, the off-state current in this specification and the like is a current which flows between a source terminal and a drain terminal when the potential of a gate electrode is less than or equal to zero with the potential of the source terminal as a reference potential while the potential of the drain terminal is greater than that of the source terminal and that of the gate electrode. Alternatively, in the case of a p-channel transistor, the off-state current in this specification and the like is a current which flows between a source terminal and a drain terminal when the potential of a gate electrode is greater than or equal to zero with the potential of the source terminal as a reference potential while the potential of the drain terminal is less than that of the source terminal and that of the gate electrode.

<Example of Manufacturing Process of Transistor>

An example of a manufacturing process of the transistor 130 according to this embodiment is described below with reference to FIGS. 2A to 2E and FIGS. 3A to 3E.

Figure 2A:
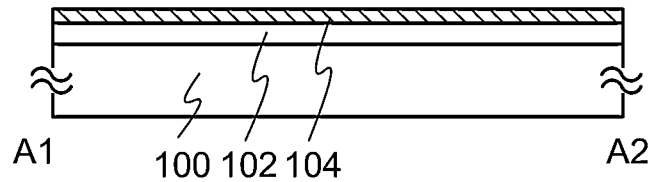
FIGS. 2A to 2E are cross-sectional views of an example of a manufacturing process of a semiconductor device.

First, the base insulating film 102 is formed over the substrate 100 (see FIG. 2A).

Although there is no particular limitation on a substrate that can be used as the substrate 100, it is preferable that the substrate have at least heat resistance to withstand a subsequent heat treatment step. For example, as the substrate 100, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 100. Alternatively, any of these substrate over which a semiconductor element is provided can be used as the substrate 100.

A semiconductor device having flexibility can be manufactured with the use of a flexible substrate as the substrate 100. For example, the transistor 130 including the oxide semiconductor film 108 may be directly formed over a flexible substrate. Alternatively, the transistor 130 may be formed over a flexible substrate in such a manner that the transistor 130 including the oxide semiconductor film 108 is formed over a manufacturing substrate, and then separated and transferred to the flexible substrate. Note that in order to separate the transistor 130 from the manufacturing substrate and transfer it to the flexible substrate, a separation layer may be provided between the manufacturing substrate and the transistor 130 including the oxide semiconductor film 108.

The base insulating film 102 can have a single-layer structure or a stacked-layer structure including one or more films selected from those containing silicon oxide, silicon nitride, silicon oxynitride, silicon nitride oxide, aluminum oxide, aluminum nitride, aluminum oxynitride, aluminum nitride oxide, hafnium oxide, gallium oxide, and a mixed material of any of these materials. Note that the base insulating film 102 preferably has a single-layer structure or a stacked-layer structure including an oxide insulating film so that the oxide insulating film is in contact with an oxide semiconductor film 104 to be formed later. Note that the insulating film 102 is not necessarily provided.

The base insulating film 102 preferably has a region (hereinafter also referred to as an oxygen-excess region) containing oxygen the proportion of which is higher than the stoichiometric proportion (hereinafter also referred to as excess oxygen). For example, in the case of using a silicon oxide film as the base insulating film 102, the composition formula is preferably $SiO_{2+\alpha}$ ($\alpha$?0). Excess oxygen contained in the base insulating film 102 can fill oxygen vacancies in the oxide semiconductor film 104 (or in the oxide semiconductor film 108) formed later. In the case where the base insulating film 102 has a stacked-layer structure, it is preferable that a film in contact with the oxide semiconductor film 104 (or the oxide semiconductor film 108) at least have an oxygen-excess region. In order to form the oxygen-excess region in the base insulating film 102, for example, the base insulating film 102 may be formed in an oxygen atmosphere. Alternatively, the oxygen-excess region may be formed by introducing oxygen (including at least one of an oxygen radical, an oxygen atom, and an oxygen ion) to the base insulating film 102 after its formation. Oxygen can be introduced by an ion implantation method, an ion doping method, a plasma immersion ion implantation method, plasma treatment, or the like.

Here, planarization treatment may be performed on the base insulating film 102. There is no particular limitation on the planarization treatment, and polishing treatment, dry etching treatment, plasma treatment, or the like can be used.

As plasma treatment, reverse sputtering in which an argon gas is introduced and plasma is generated can be performed, for example. The reverse sputtering is a method in which voltage is applied to a substrate side in an argon atmosphere by using an RF power supply and plasma is generated in the vicinity of the substrate to modify a surface. Note that instead of an argon atmosphere, a nitrogen atmosphere, a helium atmosphere, an oxygen atmosphere, or the like may be used. Powder substances (also referred to as particles or dust) which are attached to a surface of the base insulating film 102 can be removed by reverse sputtering.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the condition of the surface of the base insulating film 102.

The average surface roughness ($R_a$) of the surface of the base insulating film 102 can be less than or equal to 0.15 nm, preferably less than or equal to 0.1 nm by performing the planarization treatment on the base insulating film 102. Being formed over such a planarized surface, the oxide semiconductor film 104 can also have a planarized surface. When the oxide semiconductor film 104 is a CAAC-OS film, the oxide semiconductor film 104 preferably has a planarized surface, in which case the crystallinity can be improved.

Note that $R_a$ is obtained by three-dimension expansion of arithmetic mean surface roughness that is defined by JIS B 0601:2001 (ISO 4287:1997) so as to be applied to a curved surface. In addition, $R_a$ is an "average value of the absolute values of deviations from a reference surface to a specific surface" and is defined by the following formula.

$$Ra > \frac{1}{S_0} \int_{y_1}^{y_2} \int_{x_1}^{x_2} |f(x, y) - Z_0| dx dy \qquad \text{[Formula 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. So represents the area of a rectangle which is obtained by projecting the specific surface on the xy plane, and $Z_0$ represents the height of the reference surface (the average height of the specific surface). $R_a$ can be measured using an atomic force microscope (AFM).

Next, the oxide semiconductor film 104 is formed over the base insulating film 102 (see FIG. 2A). The thickness of the oxide semiconductor film 104 is greater than or equal to 3 nm and less than or equal to 30 nm, preferably greater than or equal to 5 nm and less than or equal to 20 nm, for example.

The oxide semiconductor film 104 can be formed by a sputtering method, a molecular beam epitaxy (MBE) method, a CVD method, a pulsed laser deposition method, an atomic layer deposition (ALD) method, or the like. The oxide semiconductor film 104 may be formed with the use of a sputtering apparatus which performs deposition in the state where top surfaces of a plurality of substrates are substantially perpendicular to a top surface of a sputtering target.

In the formation of the oxide semiconductor film 104, the concentration of hydrogen contained in the oxide semiconductor film 104 is preferably reduced. In order to reduce the concentration of hydrogen contained in the oxide semiconductor film 104, for example, in the case where the oxide semiconductor film is formed by a sputtering method, oxygen, a high-purity rare gas (typically, argon) from which impurities such as hydrogen, water, a hydroxyl group, or hydride have been removed, or a mixed gas of oxygen and the rare gas is used as appropriate as an atmosphere gas supplied to a treatment chamber of a sputtering apparatus.

The oxide semiconductor film 104 is formed in such a manner that a sputtering gas from which hydrogen and moisture have been removed is introduced into a deposition chamber while moisture remaining in the deposition chamber is removed, whereby the concentration of hydrogen in the formed oxide semiconductor film 104 can be reduced. In order to remove moisture remaining in the deposition chamber, an entrapment vacuum pump such as a cryopump, an ion pump, or a titanium sublimation pump is preferably used. A turbo molecular pump to which a cold trap is added may be used. The deposition chamber which is evacuated with a cryopump has a high capability in removing a compound containing a hydrogen atom, such as a hydrogen molecule and water ($H_2O$) (preferably, also a compound containing a carbon atom), and the like; therefore, the concentration of impurities contained in the oxide semiconductor film 104 formed in the deposition chamber can be reduced.

Further, when the oxide semiconductor film 104 is formed by a sputtering method, the relative density (fill rate) of a metal oxide target that is used for forming the oxide semiconductor film 104 is greater than or equal to 90 & and less than or equal to 100 &, preferably greater than or equal to 95 & and less than or equal to 99.9 &. With the use of a metal oxide target with a high relative density, the formed oxide semiconductor film 104 can be dense.

An oxide semiconductor used for the oxide semiconductor film 104 preferably contains at least indium (In) or zinc (Zn). In particular, both In and Zn are preferably contained. As a stabilizer for reducing variation in electric characteristics of a transistor including the oxide semiconductor, it is preferable that gallium (Ga) be additionally contained. Alternatively, it is preferable that one or more elements selected from tin (Sn), hafnium (Hf), aluminum (Al), and zirconium (Zr) be contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than In, Ga, and Zn.

Alternatively, a material represented by $InMO_3(ZnO)_m$ (m>0, and m is not an integer) may be used as the oxide semiconductor. Note that M represents one or more metal elements selected from Ga, Fe, Mn, and Co. Further alternatively, as the oxide semiconductor, a material represented by $In_2SnO_5(ZnO)_n$ (n>0, n is an integer) may be used.

For example, an In—Ga—Zn-based oxide with an atomic ratio of In:Ga:Zn>1:1:1 (>1/3:1/3:1/3), In:Ga:Zn>2:2:1 (>2/5:2/5:1/5), In:Ga:Zn>3:1:2 (>1/2:1/6:1/3), or any of oxides whose composition is in the neighborhood of the above compositions can be used. Alternatively, an In—Sn—Zn-based oxide with an atomic ratio of In:Sn:Zn>1:1:1 (>1/3:1/3:1/3), In:Sn:Zn>2:1:3 (>1/3:1/6:1/2), or In:Sn:Zn>2:1:5 (>1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the required semiconductor characteristics, it is preferable that the carrier concentration, the concentration of impurities, the defect density, the atomic ratio between a metal element and oxygen, the interatomic distance, the density, and the like be set to appropriate values.

For example, high mobility can be obtained relatively easily in the case of using an In—Sn—Zn-based oxide. However, mobility can be increased by reducing the defect density in a bulk in the case of using an In—Ga—Zn-based oxide.

Note that for example, the expression "the composition of an oxide containing In, Ga, and Zn at an atomic ratio of In:Ga:Zn>a:b:c (a, b, c>1), is in the neighborhood of the composition of an oxide containing In, Ga, and Zn at an atomic ratio of In:Ga:Zn>A:B:C (A, B, C>1)" means that a, b, and c satisfy the following relation: $(a - A)^2$, $(b - B)^2$, $(c - C)^2 \le r^2$. For example, r may be 0.05. The same applies to other oxides.

The oxide semiconductor film 104 may have either a single-layer structure or a stacked-layer structure. In addition, the oxide semiconductor film 104 may be a single crystal semiconductor film, a polycrystalline semiconductor film, an amorphous semiconductor film, or a CAAC-OS film.

For example, the oxide semiconductor film 104 having crystallinity can be obtained in such a manner that an amorphous oxide semiconductor film is formed and then, subjected to heat treatment. The heat treatment for crystallizing the amorphous oxide semiconductor film is performed at a temperature higher than or equal to 250≤C and lower than or equal to 700≤C, preferably higher than or equal to 400≤C, more preferably higher than or equal to 500≤C, even more preferably higher than or equal to 550≤C. Note that the heat treatment can also serve as another heat treatment in the manufacturing process.

There are three methods for forming a CAAC-OS film when the CAAC-OS film is used as the oxide semiconductor film 104. In one of the methods (first method), the oxide semiconductor film 104 is formed at a temperature higher than or equal to 200≤C and lower than or equal to 450≤C; thus, crystal parts, in which the c-axes are aligned in the direction perpendicular to a surface where the oxide semiconductor film 104 is formed or a surface of the oxide semiconductor film 104, are formed in the oxide semiconductor film 104. In another method (second method), the oxide semiconductor film 104 is formed to have a small thickness, and then subjected to heat treatment at a temperature higher than or equal to 200≤C and lower than or equal to 700≤C; thus, crystal parts, in which the c-axes are aligned in the direction perpendicular to a surface where the oxide semiconductor film 104 is formed or a surface of the oxide semiconductor film 104, are formed in the oxide semiconductor film 104. In the other method (third method), an oxide semiconductor film is formed to have a small thickness as a first layer and subjected to heat treatment at a temperature higher than or equal to 200≤C and lower than or equal to 700≤C, and an oxide semiconductor film is formed as a second layer; thus, crystal parts, in which the c-axes are aligned in the direction perpendicular to a surface where the oxide semiconductor film 104 is formed or a surface of the oxide semiconductor film 104, are formed in the oxide semiconductor film 104.

In addition, heat treatment (also referred to as dehydration treatment or dehydrogenation treatment) may be performed to remove impurities such as excess hydrogen and water contained in the oxide semiconductor film 104. The temperature of the heat treatment is higher than or equal to 300≤C and lower than or equal to 700≤C, or lower than the strain point of the substrate. The heat treatment can be performed under reduced pressure, a nitrogen atmosphere, or the like.

Hydrogen, which is an impurity imparting n-type conductivity, can be removed from the oxide semiconductor film 104 by the heat treatment. For example, the concentration of hydrogen in the oxide semiconductor film 104 after the heat treatment for dehydration or dehydrogenation can be lower than or equal to $5/10^{19}/cm^3$, preferably lower than or equal to $5/10^{18}/cm^3$.

Note that the heat treatment for the dehydration or dehydrogenation may be performed at any timing in the process of manufacturing the transistor 130 as long as it is performed after the formation of the oxide semiconductor film 104. In the case where an aluminum oxide film is formed as the gate insulating film 116 or the insulating film 122, the heat treatment is preferably performed before the aluminum oxide film is formed. The heat treatment for dehydration or dehydrogenation may be performed plural times, and may also serve as another heat treatment.

Note that in the case where an oxygen-excess region is formed in the base insulating film 102, the heat treatment for dehydration or dehydrogenation is preferably performed before the oxide semiconductor film 104 is processed into an island shape, in which case out-diffusion of oxygen contained in the base insulating film 102 due to the heat treatment can be prevented.

In the heat treatment, it is preferable that water, hydrogen, or the like be not contained in nitrogen or a rare gas such as helium, neon, or argon. The purity of nitrogen or the rare gas such as helium, neon, or argon which is introduced into the heat treatment apparatus is set to preferably higher than or equal to 6N (99.9999 &), more preferably higher than or equal to 7N (99.99999 &) (i.e., the concentration of impurities is preferably lower than or equal to 1 ppm, more preferably lower than or equal to 0.1 ppm).

In addition, after the oxide semiconductor film 104 is heated by the heat treatment, a high-purity oxygen gas, a high-purity dinitrogen monoxide gas, or ultra dry air (the amount of moisture is less than or equal to 20 ppm (å55≤C by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably higher than or equal to 6N, more preferably higher than or equal to 7N (i.e., the concentration of impurities in the oxygen gas or the dinitrogen monoxide gas is preferably lower than or equal to 1 ppm, more preferably lower than or equal to 0.1 ppm). The oxygen gas or the dinitrogen monoxide gas acts to supply oxygen and that is reduced by the step for removing impurities for the dehydration or dehydrogenation, so that the oxide semiconductor film 104 can be a high-purity and electrically i-type (intrinsic) oxide semiconductor film.

Figure 2B:
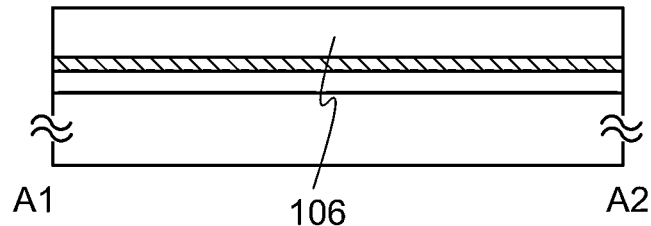

Next, an insulating film 106 is formed over the oxide semiconductor film 104 (see FIG. 2B).

The insulating film 106 is formed using a film containing any of silicon oxide, silicon nitride, silicon oxynitride, silicon nitride oxide, aluminum oxide, aluminum nitride, aluminum oxynitride, aluminum nitride oxide, hafnium oxide, and gallium oxide, or a film containing a mixed material of any of these. The insulating film 106 is preferably formed to have a thickness which withstands polishing treatment because the insulating film 106 is used as a hard mask when a conductive film formed later is subjected to polishing treatment.

Note that the above-described heat treatment (heat treatment for crystallization, dehydration, or dehydrogenation) may be performed after the insulating film 106 is formed.

Figure 2C:
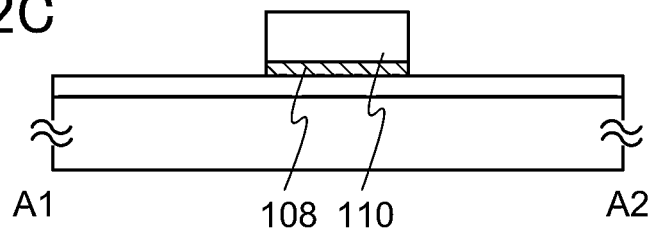

Next, a mask is formed over the oxide semiconductor film 104 and the insulating film 106 and etching treatment is performed, so that the island-shaped oxide semiconductor film 108 and an island-shaped insulating film 110 are formed (see FIG. 2C). Here, as the mask formed over the oxide semiconductor film 104 and the insulating film 106, a mask having a finer pattern which is obtained by performing a slimming process on a mask formed by a photolithography method or the like is preferably used.

As the slimming process, an ashing process in which oxygen in a radical state (oxygen radical) or the like is used can be employed, for example. The slimming process is not limited to the ashing process as long as the mask formed by a photolithography method or the like can be processed into a finer pattern. The channel length (L) of a transistor is determined by the mask formed by the slimming process; therefore, a process with high controllability is preferably employed as the slimming process.

As a result of the slimming process, the line width of the mask formed by a photolithography method or the like can be reduced to a length less than or equal to the limit of the resolution of a light exposure apparatus, preferably less than or equal to half of the limit of the resolution of the light exposure apparatus, more preferably less than or equal to one third of the limit of the resolution of the light exposure apparatus. For example, the line width can be greater than or equal to 30 nm and less than or equal to 2000 nm, preferably greater than or equal to 50 nm and less than or equal to 350 nm. A transistor can be further miniaturized by processing the oxide semiconductor film 104 and the insulating film 106 with the use of the mask.

Note that the oxide semiconductor film 108 and the insulating film 110 may be formed to have a tapered end portion by etching the oxide semiconductor film 104 and the insulating film 106 while the ashing process is performed on the mask.

Figure 2D:
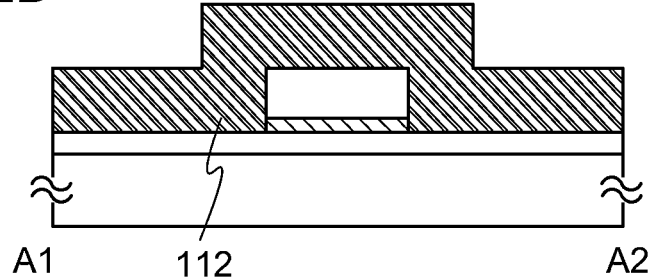

Next, a conductive film 112 to be a source electrode layer and a drain electrode layer (including a wiring formed in the same layer as the source electrode layer and the drain electrode layer) is formed over the oxide semiconductor film 108 and the insulating film 110 (see FIG. 2D). The conductive film 112 has either a single-layer structure or a stacked-layer structure.

The conductive film 112 can be formed by a plasma CVD method, a sputtering method, or the like. The conductive film 112 is formed with the use of a material that can withstand heat treatment which is performed later. As the conductive film 112, for example, a metal film containing an element selected from aluminum (Al), chromium (Cr), copper (Cu), tantalum (Ta), titanium (Ti), molybdenum (Mo), and tungsten (W), a metal nitride film containing any of the above elements as its component (e.g., a titanium nitride film, a molybdenum nitride film, or a tungsten nitride film), or the like can be used. A high-melting-point metal film of titanium, molybdenum, tungsten, or the like or a metal nitride film of any of these elements (e.g., a titanium nitride film, a molybdenum nitride film, or a tungsten nitride film) may be stacked on at least one of a lower side and an upper side of the metal film of aluminum, copper, or the like.

As the material of the conductive film 112, a conductive metal oxide material can be also used. As a conductive metal oxide film, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide films to which silicon oxide is added can be used. A stacked-layer structure of the metal film and the metal oxide film can be used.

Figure 2E:
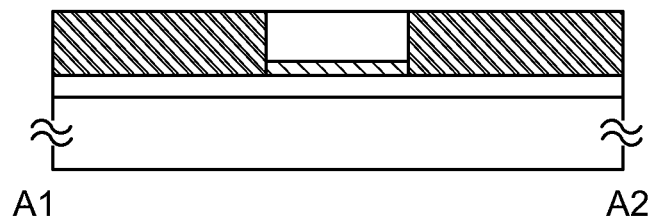

Next, polishing (cutting or grinding) treatment is performed on the conductive film 112 to remove part of the conductive film 112 so that the insulating film 110 is exposed (see FIG. 2E). Through the polishing treatment, the conductive film 112 in a region overlapping with the oxide semiconductor film 108 is removed. For the polishing (cutting or grinding) treatment, chemical mechanical polishing (CMP) treatment can be preferably used. In this embodiment, the conductive film 112 in the region overlapping with the oxide semiconductor film 108 is removed by CMP treatment.

Note that in this embodiment, the CMP treatment is used for removing the conductive film 112 in the region overlapping with the oxide semiconductor film 108; however, another polishing (grinding or cutting) treatment may be used. Alternatively, the polishing treatment such as the CMP treatment may be combined with etching (dry etching or wet etching) treatment or plasma treatment. For example, after the CMP treatment, dry etching treatment or plasma treatment (reverse sputtering or the like) may be performed to improve the planarity of a surface to be processed. In the case where the polishing treatment is combined with etching treatment, plasma treatment or the like, the order of the steps is not particularly limited, and may be set as appropriate depending on the material, thickness, and roughness of a surface of the conductive film 112.

In the case where the conductive film 112 is formed over the oxide semiconductor film 108 and the polishing treatment is performed, a surface of the oxide semiconductor film 108 is shaved by the polishing treatment, and thus a top surface of the oxide semiconductor film 108 might be positioned lower than a top surface of the conductive film 112. In this embodiment, with the use of the island-shaped insulating film 110 as a hard mask, the polishing treatment can be performed on the conductive film 112 without the surface of the oxide semiconductor film 108 being shaved, which is preferable.

Note that the CMP treatment may be performed only once or plural times. When the CMP treatment is performed plural times, first polishing is preferably performed with a high polishing rate followed by final polishing with a low polishing rate. By performing polishing steps with different polishing rates in combination, the planarity of the surface of the conductive film 112 can be further improved.

Next, the insulating film 110 is removed, so that the surface of the oxide semiconductor film 108 is exposed. Then, a mask is formed over the conductive film 112 and etching treatment is performed, whereby the source electrode layer 114a and the drain electrode layer 114b are formed (see FIG. 3A). Dry etching is preferably used to remove the insulating film 110.

In the case of forming the source electrode layer 114a and the drain electrode layer 114b by etching with the use of a resist mask, a high level of alignment accuracy is required because the oxide semiconductor film 108 has a narrow line width. In the method for manufacturing a transistor shown in this embodiment, polishing treatment is used for forming the source electrode layer 114a and the drain electrode layer 114b, whereby the source electrode layer 114a and the drain electrode layer 114b which are in contact with side surfaces of the oxide semiconductor film 108 can be formed in a self-aligned manner. Thus, in the case where the width of the oxide semiconductor film 108 in the channel length direction is miniaturized, an accurate process can be performed precisely. Therefore, in a manufacturing process of a semiconductor device, the transistor 130 with a minute structure in which variations in the shapes of the source electrode layer 114a and the drain electrode layer 114b are small can be manufactured with a high yield.

Note that after the insulating film 110 is removed, oxygen (at least containing any of an oxygen radical, an oxygen atom, and an oxygen ion) may be introduced to the exposed oxide semiconductor film 108.

Introduction of oxygen to the oxide semiconductor film 108 enables the oxide semiconductor film 108 to be highly purified and to be i-type (intrinsic). Variation in the electric characteristics of a transistor including an i-type (intrinsic) oxide semiconductor film is suppressed and the transistor is electrically stable.

In the step of introducing oxygen to the oxide semiconductor film 108, oxygen may be directly introduced to the oxide semiconductor film 108 or may be introduced to the oxide semiconductor film 108 through the gate insulating film 116 formed later. In the case of introducing oxygen to the oxide semiconductor film 108 through the gate insulating film 116, an ion implantation method, an ion doping method, a plasma immersion ion implantation method, or the like may be used. In the case of directly introducing oxygen to the exposed oxide semiconductor film 108, plasma treatment or the like can be used in addition to the above-described methods. The step of introducing oxygen to the oxide semiconductor film 108 may be performed plural times.

Figure 3A:
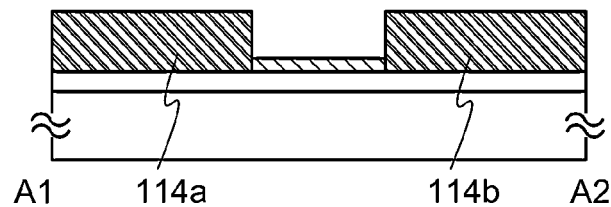
FIGS. 3A to 3E are cross-sectional views of the example of the manufacturing process of the semiconductor device.
Figure 3B:
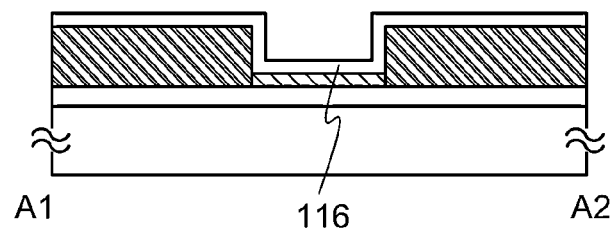

Next, the gate insulating film 116 is formed over the oxide semiconductor film 108, the source electrode layer 114a, and the drain electrode layer 114b (see FIG. 3B).

The gate insulating film 116 can be formed to have a thickness greater than or equal to 1 nm and less than or equal to 20 nm by a sputtering method, an MBE method, a CVD method, a pulsed laser deposition method, an ALD method, or the like as appropriate. The gate insulating film 116 may be formed with the use of a sputtering apparatus which performs deposition in the state where top surfaces of a plurality of substrates are substantially perpendicular to a top surface of a sputtering target. Further, the gate insulating film 116 is preferably formed in consideration of the size of a transistor to be formed and the step coverage with the gate insulating film 116. Note that the Loff region in the oxide semiconductor film 108 can be determined depending on the thickness of the gate insulating film 116; thus, the Loff region can be formed in a self-aligned manner.

For the gate insulating film 116, silicon oxide, gallium oxide, aluminum oxide, silicon nitride, silicon oxynitride, aluminum oxynitride, silicon nitride oxide, or the like can be used. Alternatively, a high-k material such as hafnium oxide, yttrium oxide, hafnium silicate (HfSi$_x$O$_y$ (x?0, y?0)), hafnium silicate to which nitrogen is added (HfSiO$_x$N$_y$ (x?0, y?0)), hafnium aluminate (HfAl$_x$O$_y$ (x?0, y?0)), or lanthanum oxide can be used as the material of the gate insulating film 116, in which case gate leakage current can be reduced. With the use of any of these materials, the gate insulating film 116 is formed to have either a single-layer structure or a stacked-layer structure.

The gate insulating film 116 preferably includes an oxygen-excess region like the base insulating film 102, in which case oxygen vacancies in the oxide semiconductor film 108 can be filled with the excess oxygen contained in the gate insulating film 116. In the case where the gate insulating film 116 has a stacked-layer structure, the gate insulating film 116 preferably includes an oxygen-excess region at least in a layer in contact with the oxide semiconductor film 108. In order to provide the oxygen-excess region in the gate insulating film 116, for example, the gate insulating film 116 may be formed in an oxygen atmosphere. Alternatively, the oxygen-excess region may be formed by introducing oxygen (including at least one of an oxygen radical, an oxygen atom, and an oxygen ion) to the gate insulating film 116 after its formation. Oxygen can be introduced by an ion implantation method, an ion doping method, a plasma immersion ion implantation method, plasma treatment, or the like.

Note that in the case where oxygen is introduced to the gate insulating film 116 after its formation, by the introduction of oxygen, oxygen may be also introduced to the oxide semiconductor film 108 at the same time. After oxygen is introduced to the gate insulating film 116, heat treatment is preferably performed. The heat treatment temperature can be, for example, higher than or equal to 300≤C and lower than or equal to 450≤C. Note that the heat treatment can also serve as dehydration or dehydrogenation treatment of the oxide semiconductor film 108.

Note that the timing of introduction of oxygen to the gate insulating film 116 is not particularly limited as long as it is after the formation of the gate insulating film 116. A plurality of methods for introducing oxygen can be combined. For example, after the formation of the gate insulating film 116, oxygen may be introduced by an ion implantation method and plasma treatment, and then heat treatment may be performed.

Figure 3C:
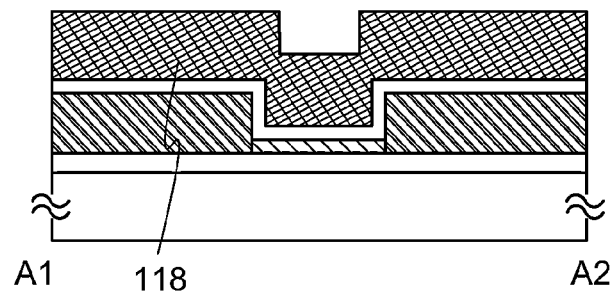

Next, a conductive film 118 serving as a gate electrode layer (including a wiring formed in the same layer as the gate electrode layer) is formed over the gate insulating film 116 (see FIG. 3C). The conductive film 118 may have a single-layer structure or a stacked-layer structure.

The conductive film 118 can be formed by a plasma CVD method, a sputtering method, or the like. The conductive film 118 can be formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a semiconductor film typified by a polycrystalline silicon film doped with an impurity element such as phosphorus, or a silicide film such as a nickel silicide film may be used as the conductive film 118.

For the conductive film 118, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used. The conductive film 118 can also have a stacked-layer structure of the above conductive material and the above metal material.

As one layer in a stacked-layer structure of the conductive film 118 (which serves as a gate electrode layer later) which is in contact with the gate insulating film 116, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. Such a film has a work function higher than or equal to 5 eV (electron volt), preferably higher than or equal to 5.5 eV, and when this film is used as the gate electrode layer, the threshold voltage of a transistor can be shifted to the positive side; accordingly, a normally-off switching element can be provided.

Next, polishing (cutting or grinding) treatment is performed on the conductive film 118, whereby part of the conductive film 118 is removed so that part of the gate insulating film 116 is exposed. Through the polishing treatment, the conductive film 118 in a region overlapping with the source electrode layer 114a and the drain electrode layer 114b is removed. In this embodiment, CMP treatment is used to remove the conductive film 118 in the region overlapping with the source electrode layer 114a and the drain electrode layer 114b.

Since the thickness of the source electrode layer 114a and the drain electrode layer 114b is larger than that of the oxide semiconductor film 108, a step is formed between the top surface of the oxide semiconductor film 108 and the top surfaces of the source electrode layer 114a and the drain electrode layer 114b. The polishing treatment is performed on the conductive film 118 formed over the gate insulating film 116 with the use of this step, so that the conductive film 118 in the region overlapping with the source electrode layer 114a and the drain electrode layer 114b can be removed.

Figure 3D:
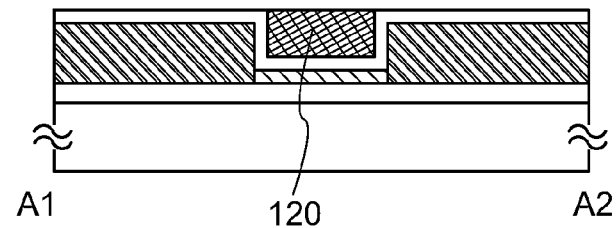

Next, a mask is formed over the conductive film 118 and etching treatment is performed, whereby the gate electrode layer 120 is formed (see FIG. 3D). Thus, the gate electrode layer 120 can be formed in a region overlapping with the oxide semiconductor film 108.

In the case of forming the gate electrode layer 120 by etching with the use of a resist mask, precise alignment of the oxide semiconductor film with a narrow line width and the gate electrode layer with a narrow line width is necessary. In the method for manufacturing a transistor described in this embodiment, polishing treatment is used for forming the gate electrode layer 120 in the region overlapping with the oxide semiconductor film 108, so that the gate electrode layer 120 can be formed in the region overlapping with the oxide semiconductor film 108 in a self-aligned manner. Thus, an accurate process can be performed precisely even in the case where the width of the oxide semiconductor film 108 in the channel length direction is miniaturized. Consequently, in the manufacturing process of the semiconductor device, a transistor with minute structures in which variations in the shapes of the gate electrode layer 120 are small can be manufactured with a high yield.

Figure 3E:
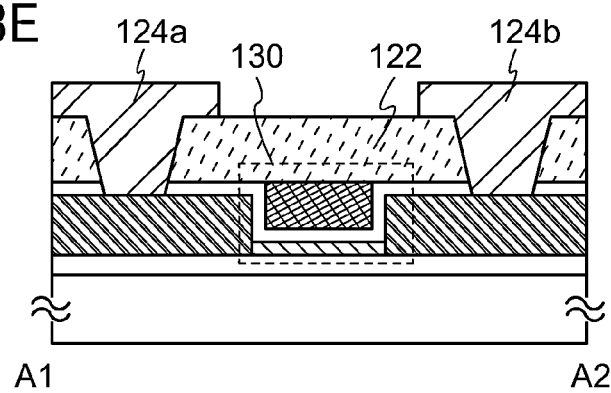

Next, the insulating film 122 is formed over the gate insulating film 116 and the gate electrode layer 120 (see FIG. 3E). The insulating film 122 may have a single-layer structure or a stacked-layer structure.

The insulating film 122 can be formed by a plasma CVD method, a sputtering method, an evaporation method, or the like. In particular, the insulating film 122 is preferably formed by a method, such as a sputtering method, by which impurities such as water or hydrogen does not enter the insulating film 122.

As the insulating film 122, an inorganic insulating film such as a silicon oxide film, a silicon oxynitride film, an aluminum oxynitride film, or a gallium oxide film, or the like can be used. Alternatively, as the insulating film 122, an aluminum oxide film, a hafnium oxide film, a magnesium oxide film, a zirconium oxide film, a lanthanum oxide film, a barium oxide film, or a metal nitride film (e.g., an aluminum nitride film) can be used.

Note that an aluminum oxide film is preferably provided as the insulating film 122. An aluminum oxide film has a superior shielding effect (blocking effect), which is not permeable to either oxygen or impurities such as hydrogen or moisture. Therefore, in and after the manufacturing process of a transistor, the aluminum oxide film functions as a protective film for preventing entry of impurities such as hydrogen or moisture, which cause a change in electric characteristics, into the oxide semiconductor film 108 and release of oxygen from the oxide semiconductor film 108. For this reason, the aluminum oxide film can be preferably used.

In order to remove moisture remaining in a deposition chamber of the insulating film 122 in a manner similar to that of the formation of the oxide semiconductor film 104, an entrapment vacuum pump (such as a cryopump) is preferably used. When the insulating film 122 is formed in the deposition chamber evacuated using a cryopump, the concentration impurities contained in the insulating film 122 can be reduced. As an evacuation unit for removing moisture remaining in the deposition chamber of the insulating film 122, a turbo molecular pump provided with a cold trap may be used.

Next, an opening reaching the source electrode layer 114a or the drain electrode layer 114b is formed in the insulating film 122 and the gate insulating film 116, and a conductive film serving as a wiring layer is formed in the opening. Then, a mask is formed over the conductive film and etching treatment is performed, whereby the wiring layer 124a and the wiring layer 124b are formed (see FIG. 3E). With the use of the wiring layers 124a and 124b, the transistor 130 is connected to another transistor or another element to form a variety of circuits.

The wiring layers 124a and 124b can be formed using a material and a method similar to those of the gate electrode layer 120, the source electrode layer 114a, and the drain electrode layer 114b. For example, a metal film containing an element selected from aluminum (Al), chromium (Cr), copper (Cu), tantalum (Ta), titanium (Ti), molybdenum (Mo), and tungsten (W), a metal nitride film containing any of the above elements as its component (e.g., a titanium nitride film, a molybdenum nitride film, or a tungsten nitride film), or the like can be used to form the wiring layer 124a and the wiring layer 124b. A high-melting-point metal film of titanium, molybdenum, tungsten, or the like or a metal nitride film of any of these elements (e.g., a titanium nitride film, a molybdenum nitride film, or a tungsten nitride film) may be stacked on at least one of a lower side and an upper side of the metal film of aluminum, copper, or the like.

Further, a conductive metal oxide can be used as the material of the wiring layer 124a and the wiring layer 124b. As the conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials to which silicon oxide is added can be used. The wiring layer 124a and the wiring layer 124b can also have a stacked-layer structure of the above conductive material and the above metal oxide material.

For example, as the wiring layer 124a and the wiring layer 124b, a single layer of molybdenum, a stack of a tantalum nitride film and a copper film, or a stack of a tantalum nitride film and a tungsten film can be used.

Through the above process, the transistor 130 in this embodiment can be manufactured.

According to one embodiment of the present invention, the source electrode layer and the drain electrode layer which are in contact with side surfaces of the oxide semiconductor film can be formed in a self-aligned manner, which results in an improvement in the location accuracy of the oxide semiconductor film and the source and drain electrode layers. Further, the gate electrode layer provided in the region overlapping with the oxide semiconductor film can be formed in a self-aligned manner; therefore, the location accuracy of the oxide semiconductor film and the gate electrode layer can be improved. Thus, deterioration in the shape and characteristics of the transistor can be prevented.

In addition, according to one embodiment of the present invention, a region where the gate electrode layer overlaps with the source electrode layer and the drain electrode layer with the gate insulating film provided therebetween can be formed in a self-aligned manner. Thus, a decrease in on-state current of the transistor can be suppressed.

As described above, according to one embodiment of the present invention, the problems due to miniaturization can be solved. As a result, the size of the transistor can be sufficiently reduced. When the size of the transistor is sufficiently reduced, the area occupied by a semiconductor device is also reduced; thus, the number of semiconductor devices manufactured from one substrate is increased. Thus, the manufacturing cost per semiconductor device can be reduced. Further, since the semiconductor device is downsized, a semiconductor device with a size similar to that of the conventional semiconductor device can have improved functions. That is, miniaturization of a transistor including an oxide semiconductor can be achieved according to one embodiment of the present invention, and various effects accompanied with the miniaturization can be obtained.

Consequently, a semiconductor device which is miniaturized while favorable characteristics thereof are maintained can be provided according to one embodiment of the present invention. In addition, such a miniaturized semiconductor device can be provided with a high yield.

The structures and methods described in this embodiment can be combined as appropriate with any of the structures and methods described in the other embodiments.

Embodiment 2

In this embodiment, an example of a semiconductor device using a transistor according to one embodiment of the present invention, being capable of holding stored data even when power is not supplied, and having no limitation on the number of write cycles is described with reference to drawings.

Figure 4A:
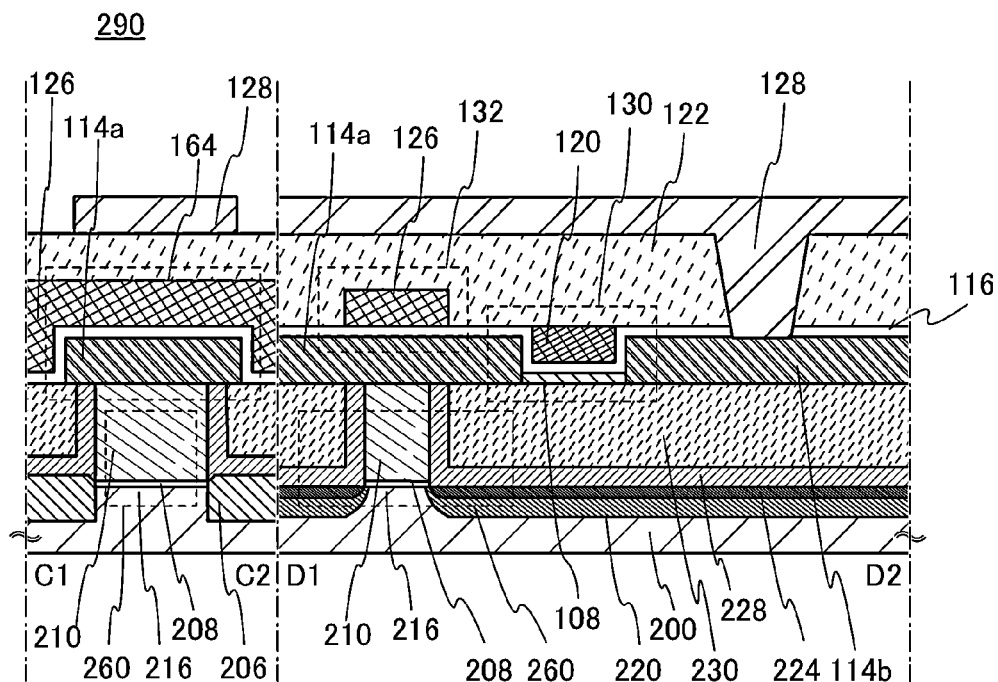
FIGS. 4A to 4C are a cross-sectional view, a plan view, and a circuit diagram of one embodiment of a semiconductor device.
Figure 4B:
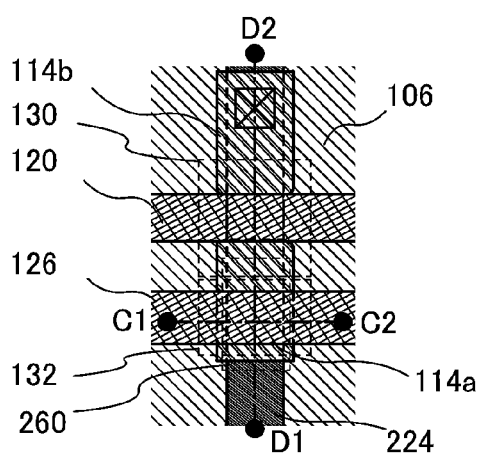
Figure 4C:
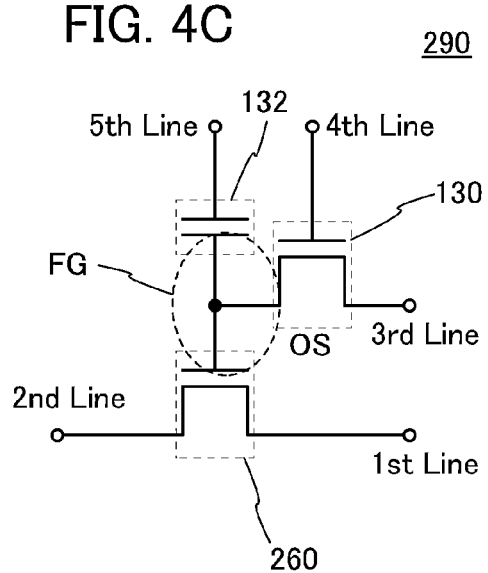

FIGS. 4A to 4C illustrate an example of a structure of a semiconductor device. FIG. 4A illustrates a cross-sectional view of the semiconductor device, FIG. 4B illustrates a plan view of the semiconductor device, and FIG. 4C illustrates a circuit diagram of the semiconductor device. Here, FIG. 4A corresponds to cross sections taken along a line C1-C2 and a line D1-D2 in FIG. 4B.

The semiconductor device (a memory cell 290) illustrated in FIGS. 4A and 4C includes a transistor 260 including a first semiconductor material in a lower portion, and the transistor 130 including a second semiconductor material in an upper portion. The structure of the transistor 130 described in Embodiment 1 is used for the transistor 130 illustrated in FIGS. 4A to 4C.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor can hold a charge for a long time owing to its characteristics.

The semiconductor material included in the transistor 260 can be silicon, germanium, silicon germanium, silicon carbide, gallium arsenide, or the like, and is preferably a single-crystal semiconductor. Alternatively, an organic semiconductor material or the like may be used. A transistor including such a semiconductor material can operate sufficiently at high speed.

Note that although the transistor 260 and the transistor 130 are n-channel transistors here, it is needless to say that p-channel transistors can be used. The specific structure of the semiconductor device, such as the material used for the semiconductor device and the structure of the semiconductor device, is not necessarily limited to those described here. For example, the transistor 130 including an oxide semiconductor described in Embodiment 1 may be used as the transistor 260 for holding data.

The transistor 260 in FIG. 4A includes a channel formation region 216 provided in a substrate 200 including a semiconductor material (e.g., silicon), impurity regions 220 provided so that the channel formation region 216 is sandwiched therebetween, intermetallic compound regions 224 in contact with the impurity regions 220, a gate insulating film 208 provided over the channel formation region 216, and the gate electrode layer 210 provided over the gate insulating film 208. Note that a transistor whose source electrode layer and drain electrode layer are not illustrated in a drawing may be referred to as a transistor for the sake of convenience. In such a case, in description of a connection of a transistor, a source region and a source electrode layer may be collectively referred to as a source electrode layer, and a drain region and a drain electrode layer may be collectively referred to as a drain electrode layer. That is, in FIGS. 4A to 4C, the term "source electrode layer" may include a source region.

An element separation insulating film 206 is provided over the substrate 200 to surround the transistor 260, and an insulating film 228 and an insulating film 230 are provided to cover the transistor 260. Note that in the transistor 260, sidewall insulating films may be formed on side surfaces of the gate electrode layer 210, and the impurity regions 220 may each include regions having different concentrations of impurities.

The transistor 260 using a single crystal semiconductor substrate can operate at high speed. Thus, when the transistor is used as a reading transistor, data can be read at high speed. In this embodiment, the two insulating films are formed to cover the transistor 260. Note that the insulating film may also be formed as a single layer or a stacked layer of three or more layers. As treatment prior to the formation of the transistor 130 and a capacitor 132, CMP treatment is performed on the insulating films formed over the transistor 260, whereby the insulating film 228 and the insulating film 230 which are planarized are formed and, at the same time, a top surface of the gate electrode layer 210 is exposed.

As each of the insulating film 228 and the insulating film 230, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used, for example. The insulating film 228 and the insulating film 230 can be formed by a plasma CVD method, a sputtering method, or the like.

Alternatively, an organic material such as polyimide, an acrylic resin, or a benzocyclobutene-based resin can be used. Other than the above-described organic materials, it is also possible to use a low-dielectric constant material (a low-k material) or the like. In the case of using an organic material, the insulating film 228 and the insulating film 230 may be formed by a wet method such as a spin coating method or a printing method.

Note that in this embodiment, a silicon nitride film is used as the insulating film 228, and a silicon oxide film is used as the insulating film 230.

Planarization treatment is preferably performed on a region, where the oxide semiconductor film 108 is formed, in a surface of the insulating film 230. In this embodiment, the oxide semiconductor film 108 is formed over the insulating film 230 which is sufficiently planarized by polishing treatment such as CMP treatment (the average surface roughness of the surface of the insulating film 230 is preferably less than or equal to 0.15 nm).

The transistor 130 illustrated in FIG. 4A includes an oxide semiconductor in a channel formation region. Here, impurities such as hydrogen or water and oxygen vacancies are preferably reduced in the oxide semiconductor film 108 included in the transistor 130. With the use of such an oxide semiconductor, the transistor 130 having extremely favorable off-state characteristics can be obtained.

Since the off-state current of the transistor 130 is small, the transistor 130 enables stored data to be held for a long time. In other words, a semiconductor memory device in which refresh operation is unnecessary or the frequency of refresh operation is extremely low can be provided, resulting in a sufficient reduction in power consumption.

Here, the gate electrode layer 120 of the transistor 130 is provided in a depressed portion formed by a step between a top surface of the oxide semiconductor film 108 and top surfaces of the source electrode layer 114a and the drain electrode layer 114b. The thickness of the gate insulating film 116 (greater than or equal to 1 nm and less than or equal to 20 nm) determines a region of the oxide semiconductor film 108 which does not overlap with the gate electrode layer 120 (i.e., Loff region). Although the Loff region exists in the oxide semiconductor film 108, the thickness thereof is the same as that of the gate insulating film 116 and thus is sufficiently small. When a transistor 130 is in an on state, the same electric field due to the gate electrode layer 120 as that applied to a channel formation region is applied to the Loff region; thus, the resistance of the Loff region can be sufficiently lowered when the transistor 130 is in an on state. Consequently, a decrease in the on-state current of the transistor 130 can be suppressed.

The formation of the Loff region depends on the thickness of the gate insulating film 116 (greater than or equal to 1 nm and less than or equal to 20 nm); therefore, the Loff region can be formed in a self-aligned manner without precise alignment.

A conductive film 126 is provided in a region overlapping with the source electrode layer 114a of the transistor 130 with the gate insulating film 116 provided therebetween. The capacitor 132 includes the source electrode layer 114a, the gate insulating film 116, and the conductive film 126. That is, the source electrode layer 114a of the transistor 130 functions as one electrode of the capacitor 132, and the conductive film 126 functions as the other electrode of the capacitor 132. Note that in the case where a capacitor is not needed, the capacitor 132 may be omitted. Alternatively, the capacitor 132 may be separately provided above the transistor 130. Note that after the gate electrode layer 120 is formed, a conductive film is formed and etching treatment is performed with the use of a mask, whereby the conductive film 126 is formed.

The insulating film 122 is provided to cover the transistor 130 and the capacitor 132. The insulating film 122 is formed to have a single-layer structure or a stacked-layer structure.

A wiring layer 128 for connecting the transistor 130 to another transistor is provided over the insulating film 122. The wiring layer 128 is electrically connected to the drain electrode layer 114b through an opening formed in the insulating film 122, the gate insulating film 116, and the like. For a material and a formation method of the wiring layer 128, the material and the formation method of the wiring layers 124a and 124b described in Embodiment 1 can be referred to.

In FIGS. 4A and 4B, the transistor 260 is provided so as to overlap with at least part of the transistor 130, and a source region or a drain region of the transistor 260 is preferably provided so as to overlap with part of the oxide semiconductor film 108. Further, the transistor 130 and the capacitor 132 are provided so as to overlap with at least part of the transistor 260. For example, the conductive film 126 of the capacitor 132 is provided so as to overlap with at least part of the gate electrode layer 210 of the transistor 260. With such a planar layout, the area occupied by the semiconductor device can be reduced; thus, the degree of integration can be increased.

Next, an example of a circuit configuration corresponding to FIGS. 4A and 4B is illustrated in FIG. 4C.

In FIG. 4C, a first wiring (1st Line) is electrically connected to a source electrode layer of the transistor 260, and a second wiring (2nd Line) is electrically connected to a drain electrode layer of the transistor 260. A third wiring (3rd Line) is electrically connected to one of the source electrode layer and the drain electrode layer of the transistor 130, and a fourth wiring (4th Line) is electrically connected to the gate electrode layer of the transistor 130. The gate electrode layer of the transistor 260 and the other of the source electrode layer and the drain electrode layer of the transistor 130 are electrically connected to one electrode of the capacitor 132. A fifth wiring (5th Line) is electrically connected to the other electrode of the capacitor 132.

The semiconductor device in FIG. 4C utilizes a characteristic in which the potential of the gate electrode layer of the transistor 260 can be held, and thus enables data writing, holding, and reading as follows.

Writing and holding of data are described. First, the potential of the fourth wiring is set to a potential at which the transistor 130 is turned on, so that the transistor 130 is turned on. Thus, the potential of the third wiring is supplied to the gate electrode layer of the transistor 260 and the capacitor 132. In other words, a predetermined charge is supplied to the gate electrode layer of the transistor 260 (i.e., writing of data). Here, one of two kinds of charges providing different potentials (hereinafter referred to as a Low level charge and a High level charge) is given. Then, the potential of the fourth wiring is set to a potential at which the transistor 130 is turned off, so that the transistor 130 is turned off. Thus, the charge given to the gate electrode layer of the transistor 260 is held (i.e., holding of data).

Since the off-state current of the transistor 130 is extremely small, the charge of the gate electrode layer of the transistor 260 is held for a long time.

Next, reading of data is described. By supplying an appropriate potential (reading potential) to the fifth wiring while supplying a predetermined potential (constant potential) to the first wiring, the potential of the second wiring varies depending on the amount of charge held in the gate electrode layer of the transistor 260. This is because in general, when the transistor 260 is an n-channel transistor, an apparent threshold voltage $V_{th\_H}$ in the case where a High level charge is given to the gate electrode layer of the transistor 260 is lower than an apparent threshold voltage $V_{th\_L}$ in the case where a Low level charge is given to the gate electrode layer of the transistor 260. Here, an apparent threshold voltage refers to the potential of the fifth wiring, which is needed to turn on the transistor 260. Thus, the potential of the fifth wiring is set to a potential $V_0$ which is between $V_{th\_H}$ and $V_{th\_L}$, whereby a charge supplied to the gate electrode layer of the transistor 260 can be determined. For example, in the case where the High level charge is supplied in writing, when the potential of the fifth wiring is set to $V_0$ (?$V_{th\_H}$), the transistor 260 is turned on. In the case where the Low level charge is supplied in writing, even when the potential of the fifth wiring is set to $V_0$ (<$V_{th\_L}$), the transistor 260 remains in an off state. Therefore, the stored data can be read by the potential of the second wiring.

Note that in the case where memory cells are arrayed, it is necessary that data of only a desired memory cell can be read. In the case where such reading is not performed, a potential at which the transistor 260 is turned off regardless of the state of the gate electrode layer, that is, a potential smaller than $V_{th\_H}$ may be supplied to the fifth wiring. Alternatively, a potential at which the transistor 260 is turned on regardless of the state of the gate electrode layer, that is, a potential larger than $V_{th\_L}$ may be supplied to the fifth lines.

When a transistor having a channel formation region formed using an oxide semiconductor and having extremely small off-state current is applied to the semiconductor device in this embodiment, the semiconductor device can hold data for an extremely long time. In other words, power consumption can be adequately reduced because refresh operation becomes unnecessary or the frequency of refresh operation can be extremely low. Moreover, stored data can be held for a long time even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate; thus, the problem of deterioration of a gate insulating film does not occur. In other words, the semiconductor device according to one embodiment of the present invention does not have a limit on the number of times of writing which is a problem in a conventional nonvolatile memory, and reliability thereof is drastically improved. Moreover, since data is written by turning on or off the transistors, high-speed operation can be easily realized.

As described above, a miniaturized and highly-integrated semiconductor device having high electric characteristics and a method for manufacturing the semiconductor device can be provided.

The structures and methods described in this embodiment can be combined as appropriate with any of the structures and methods described in the other embodiments.

Embodiment 3

In this embodiment, a structure of a semiconductor device using the transistor described in Embodiment 1, being capable of holding stored data even when power is not supplied, and having no limitation on the number of write cycles, which is different from the structure described in Embodiment 2, is described with reference to FIGS. 5A and 5B and FIGS. 6A and 6B.

Figure 5A:
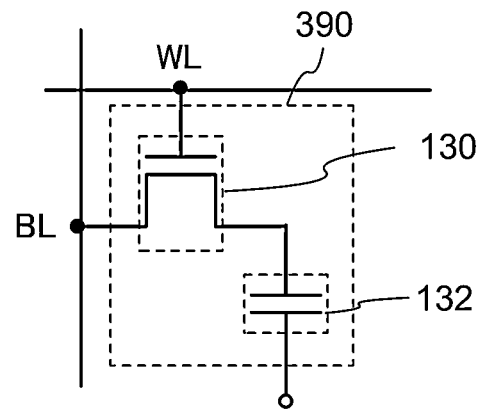
FIGS. 5A and 5B are a circuit diagram and a perspective view of one embodiment of a semiconductor device.
Figure 5B:
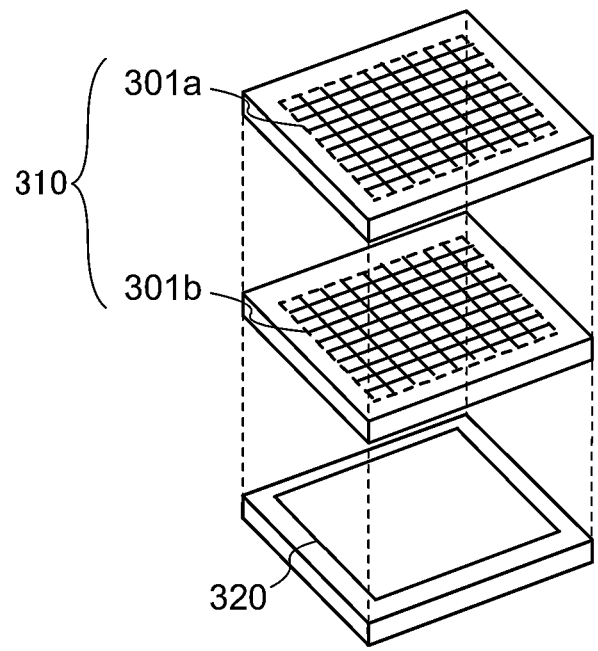

FIG. 5A illustrates an example of a circuit configuration of a semiconductor device, and FIG. 5B is a conceptual diagram illustrating an example of a semiconductor device. First, the semiconductor device illustrated in FIG. 5A is described, and then, the semiconductor device illustrated in FIG. 5B is described.

In the semiconductor device illustrated in FIG. 5A, a bit line BL is electrically connected to a source electrode layer or a drain electrode layer of the transistor 130, a word line WL is electrically connected to a gate electrode layer of the transistor 130, and the source electrode layer or the drain electrode layer of the transistor 130 is electrically connected to a first terminal of the capacitor 132.

Next, writing and holding of data in the semiconductor device (a memory cell 390) illustrated in FIG. 5A are described.

First, the potential of the word line WL is set to a potential at which the transistor 130 is turned on, so that the transistor 130 is turned on. Thus, the potential of the bit line BL is supplied to the first terminal of the capacitor 132 (i.e., writing of data). Then, the potential of the word line WL is set to a potential at which the transistor 130 is turned off, so that the transistor 130 is turned off. Thus, the potential of the first terminal of the capacitor 132 is held (i.e., holding of data).

The transistor 130 including an oxide semiconductor has extremely small off-state current. For that reason, when the transistor 130 is turned off, the potential of the first terminal of the capacitor 132 (or charge accumulated in the capacitor 132) can be held for an extremely long time.

Next, reading of data is described. When the transistor 130 is turned on, the bit line BL which is in a floating state and the capacitor 132 are electrically connected to each other, and the charge is redistributed between the bit line BL and the capacitor 132. As a result, the potential of the bit line BL is changed. The amount of change in the potential of the bit line BL varies depending on the potential of the first terminal of the capacitor 132 (or charge accumulated in the capacitor 132).

For example, the potential of the bit line BL after charge redistribution is $(C_B \cdot V_{B0}, C/V)/(C_B, C)$, where V is the potential of the first terminal of the capacitor 132, C is the capacitance of the capacitor 132, $C_B$ is the capacitance of the bit line BL (hereinafter also referred to as bit line capacitance), and $V_{B0}$ is the potential of the bit line BL before the charge redistribution. Therefore, it can be found that assuming that the memory cell 390 is in either of two states in which the potentials of the first terminal of the capacitor 132 are $V_1$ and $V_0$ ($V_1 ? V_0$), the potential of the bit line BL in the case of holding the potential $V_1$ ($>(C_B \cdot V_{B0}, C/V_1)/(C_B, C)$) is higher than the potential of the bit line BL in the case of holding the potential $V_0$ ($C_B \cdot V_{B0}, C/V_0)/(C_B, C)$).

Then, by comparing the potential of the bit line BL with a predetermined potential, data can be read.

As described above, the semiconductor device illustrated in FIG. 5A can hold a charge accumulated in the capacitor 132 for a long time because the off-state current of the transistor 130 is extremely small. In other words, power consumption can be adequately reduced because refresh operation becomes unnecessary or the frequency of refresh operation can be extremely low. Even when power is not supplied, stored data can be held for a long time.

Next, the semiconductor device illustrated in FIG. 5B is described.

The semiconductor device illustrated in FIG. 5B includes memory cell arrays 301a and 301b each including a plurality of memory cells 390 illustrated in FIG. 5A as a memory circuit in an upper portion, and a peripheral circuit 320 which is necessary for operation of a memory cell array 310 (the memory cell arrays 301a and 301b) in a lower portion. Note that the peripheral circuit 320 is electrically connected to each of the memory cell array 301a and the memory cell array 301b.

With the structure illustrated in FIG. 5B, the peripheral circuit 320 can be provided under the memory cell array 310 (the memory cell arrays 301a and 301b). Thus, the size of the semiconductor device can be decreased.

It is preferable that a semiconductor material for a transistor provided in the peripheral circuit 320 be different from that for the transistor 130. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, the transistor can favorably realize a variety of circuits (e.g., a logic circuit or a driver circuit) which needs to operate at high speed.

Note that FIG. 5B illustrates the semiconductor device including the memory cell array 310 (a structure in which the memory cell arrays 301a and 301b are stacked) as an example; however, the number of memory cell arrays to be stacked is not limited thereto. Three or more memory cell arrays may be stacked.

Next, a specific structure of the memory cell 390 illustrated in FIG. 5A is described with reference to FIGS. 6A and 6B.

Figure 6A:
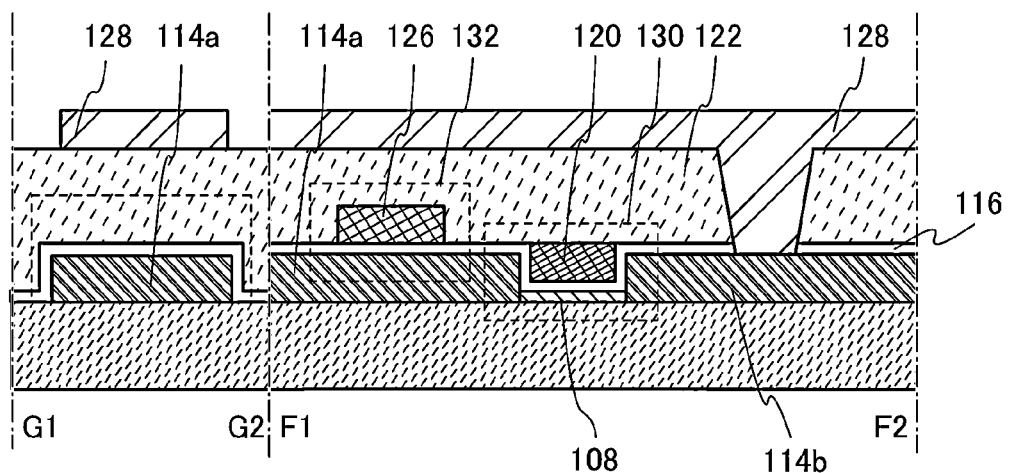
FIGS. 6A and 6B are a cross-sectional view and a plan view of one embodiment of a semiconductor device.
Figure 6B:
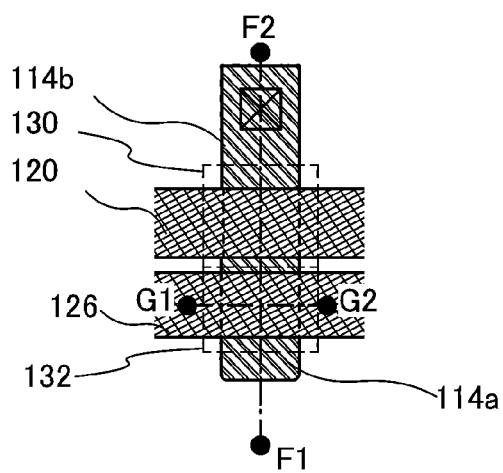

FIGS. 6A and 6B illustrate an example of a structure of the memory cell 390. FIG. 6A illustrates a cross-sectional view of the memory cell 390, and FIG. 6B is a plan view of the memory cell 390. Here, FIG. 6A corresponds to cross sections taken along a line F1-F2 and a line G1-G2 in FIG. 6B.

The transistor 130 illustrated in FIGS. 6A and 6B can have the same structure as that described in Embodiment 1.

The conductive film 126 is provided in a region overlapping with the source electrode layer 114a of the transistor 130 with the gate insulating film 116 provided therebetween. The capacitor 132 includes the source electrode layer 114a, the gate insulating film 116, and the conductive film 126. That is, the source electrode layer 114a of the transistor 130 functions as one electrode of the capacitor 132, and the conductive film 126 functions as the other electrode of the capacitor 132.

Here, the gate electrode layer 120 of the transistor 130 is provided in a depressed portion formed by a step between a top surface of the oxide semiconductor film 108 and top surfaces of the source electrode layer 114a and the drain electrode layer 114b. The thickness of the gate insulating film 116 (greater than or equal to 1 nm and less than or equal to 20 nm) determines a region of the oxide semiconductor film 108 which does not overlap with the gate electrode layer 120 (i.e., Loff region).

Although the Loff region exists in the oxide semiconductor film 108, the thickness thereof is the same as that of the gate insulating film 116 and thus is sufficiently small. When a transistor 130 is in an on state, the same electric field due to the gate electrode layer 120 as that applied to a channel formation region is applied to the Loff region; thus, the resistance of the Loff region can be sufficiently lowered when the transistor 130 is in an on state. Consequently, a decrease in the on-state current of the transistor 130 can be suppressed.

The formation of the Loff region depends on the thickness of the gate insulating film 116 (greater than or equal to 1 nm and less than or equal to 20 nm); therefore, the Loff region can be formed in a self-aligned manner without precise alignment.

The insulating film 122 is provided over the transistor 260 and the capacitor 132 to have a single-layer structure or a stacked-layer structure. Further, the memory cell 390 and the wiring layer 128 for connecting the adjacent memory cells are provided over the insulating film 122. The wiring layer 128 is electrically connected to the drain electrode layer 114b of the transistor 130 through an opening formed in the insulating film 122, the gate insulating film 116, and the like. Note that the wiring layer 128 may be directly connected to the drain electrode layer 114b. Note that the wiring layer 128 corresponds to the bit line BL in the circuit diagram in FIG. 5A.

In FIGS. 6A and 6B, the drain electrode layer 114b of the transistor 130 can also function as a source electrode layer of a transistor included in the adjacent memory cell. With such a planar layout, the area occupied by the semiconductor device can be reduced; thus, the degree of integration can be increased.

Note that when the memory cell array has a stacked-layer structure, an insulating film may be further formed over the wiring layer 128, and a transistor including an oxide semiconductor may be formed over the insulating film in a manner similar to that of the transistor 130.

When the planar layout illustrated in FIG. 6A is employed, the area occupied by the semiconductor device can be reduced; thus, the degree of integration can be increased.

As described above, the plurality of memory cells formed in multiple layers includes a transistor including an oxide semiconductor. Since the off-state current of the transistor including an oxide semiconductor is small, the transistor enables stored data to be held for a long time. In other words, the frequency of refresh operation can be extremely lowered, which results in a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor with sufficiently small off-state current). In addition, with a structure where the peripheral circuit and the memory circuit are stacked, the degree of integration of the semiconductor device can be increased.

As described above, a miniaturized and highly-integrated semiconductor device having high electric characteristics and a method for manufacturing the semiconductor device can be provided.

This embodiment can be implemented in appropriate combination with the structures described in the other embodiments.

Embodiment 4

In this embodiment, examples of application of the semiconductor device described in any of the above embodiments to portable devices such as mobile phones, smartphones, or e-book readers are described with reference to FIGS. 7A and 7B, FIG. 8, FIG. 9, and FIG. 10.

In portable devices such as a mobile phone, a smartphone, and an e-book reader, an SRAM or a DRAM is used to store image data temporarily. This is because response speed of a flash memory is low and thus a flash memory is not suitable for image processing. On the other hand, an SRAM or a DRAM has the following characteristics when used for temporary storage of image data.

Figure 7A:
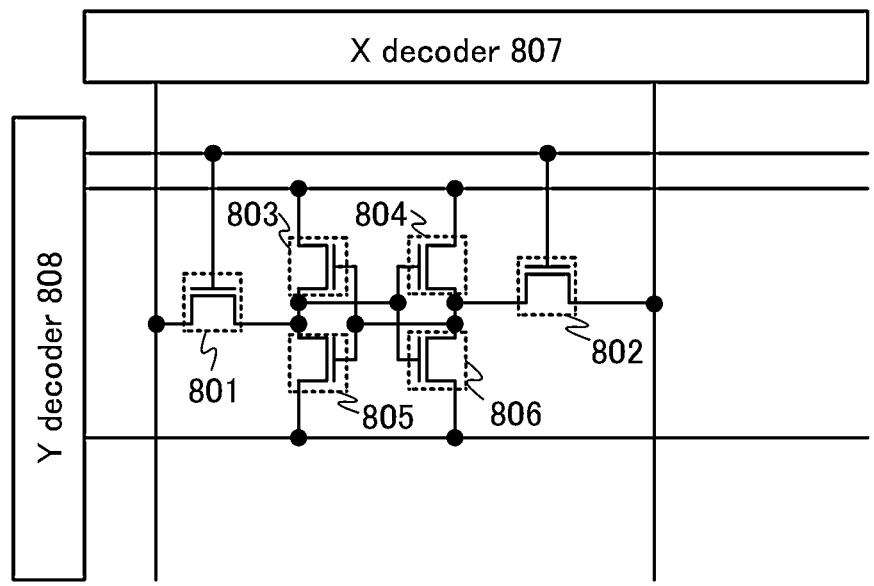
FIGS. 7A and 7B are circuit diagrams of one embodiment of a semiconductor device.

In a normal SRAM, as illustrated in FIG. 7A, one memory cell includes six transistors, which are a transistor 801, a transistor 802, a transistor 803, a transistor 804, a transistor 805, and a transistor 806, and they are driven by an X decoder 807 and a Y decoder 808. The transistors 803 and 805 form an inverter, and the transistors 804 and 806 form an inverter, which enables high-speed driving. However, since one memory cell includes six transistors, an SRAM has a disadvantage in that the area of the memory cell is large. Provided that the minimum feature size of a design rule is F, the area of a memory cell in an SRAM is generally 100 $F^2$ to 150 $F^2$. Therefore, the price per bit of an SRAM is the most expensive among memory devices.

Figure 7B:
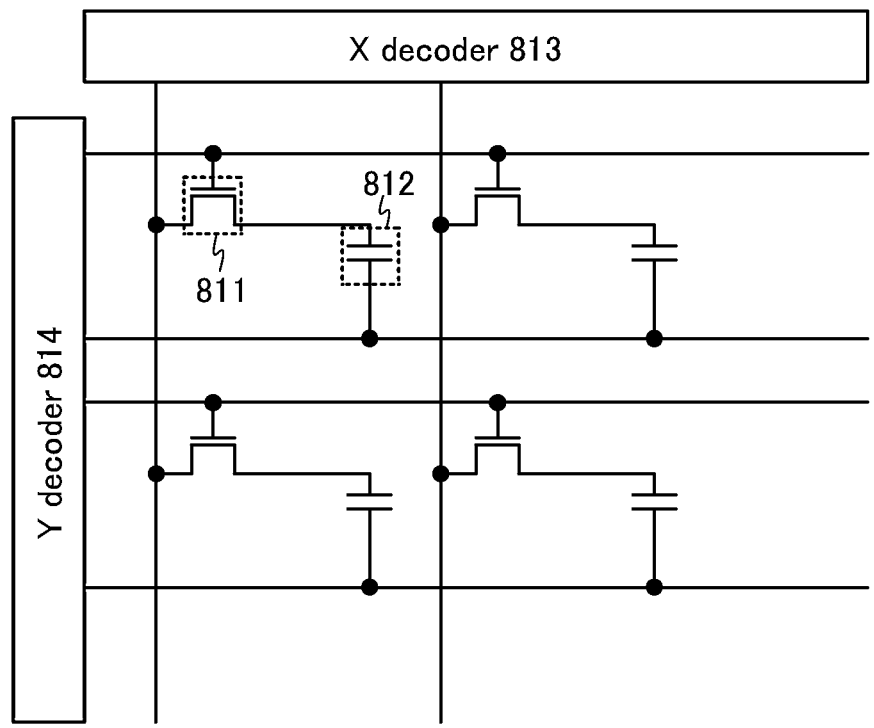

On the other hand, as illustrated in FIG. 7B, a memory cell in a DRAM includes a transistor 811 and a storage capacitor 812, and is driven by an X decoder 813 and a Y decoder 814. One cell includes one transistor and one capacitor and thus the area of the memory cell is small. The area of a memory cell of a DRAM is generally less than or equal to 10 $F^2$. Note that the DRAM needs to be refreshed periodically and consumes electric power even when a rewriting operation is not performed.

However, the area of the memory cell of the semiconductor device described in the above embodiments is about 10 $F^2$ and frequent refreshing is not needed. Therefore, the area of the memory cell is reduced, and the power consumption can be reduced.

Figure 8:
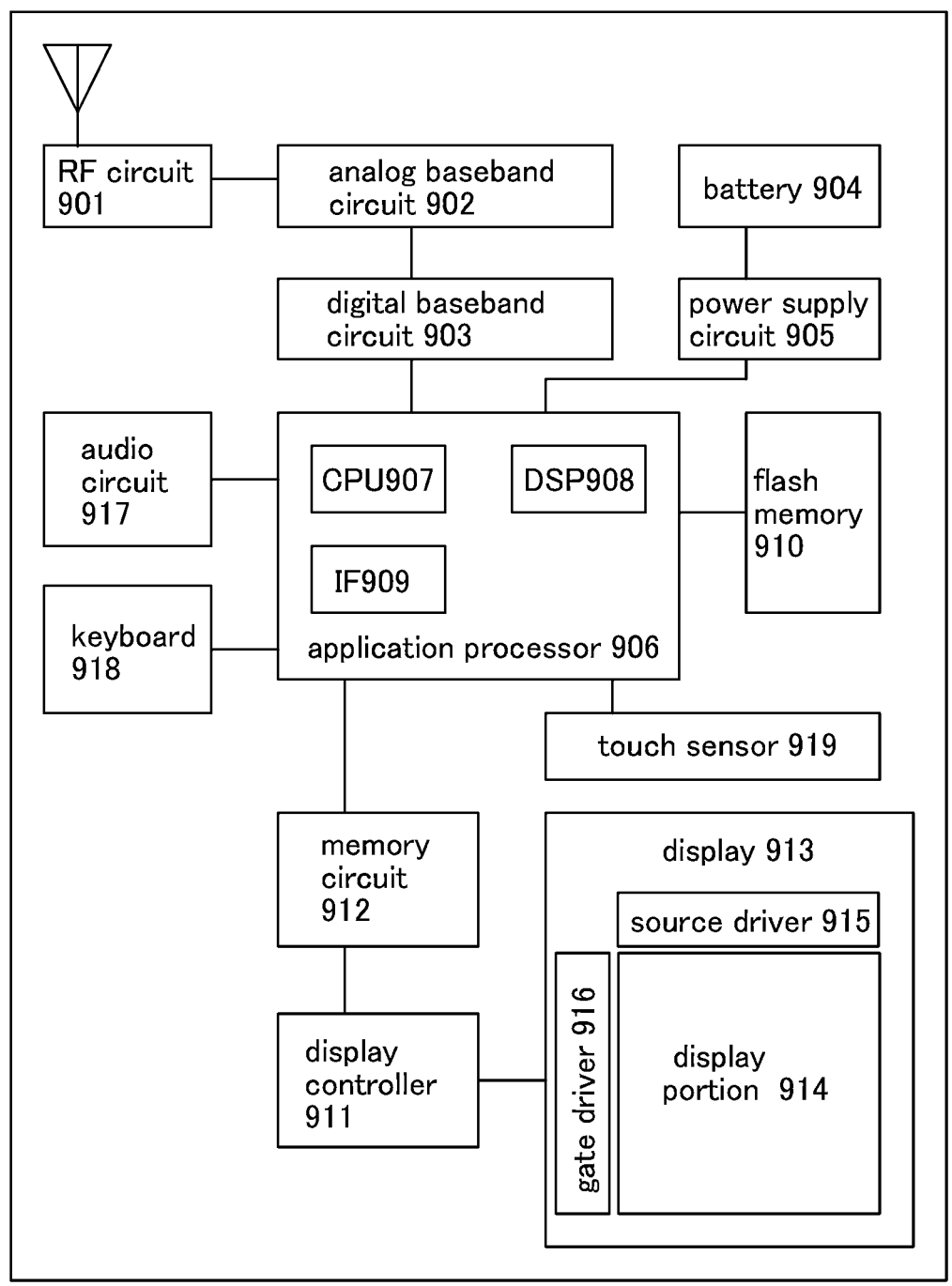
FIG. 8 is a block diagram of one embodiment of a semiconductor device.

A block diagram of a portable device is illustrated in FIG. 8. A portable device illustrated in FIG. 8 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 9:
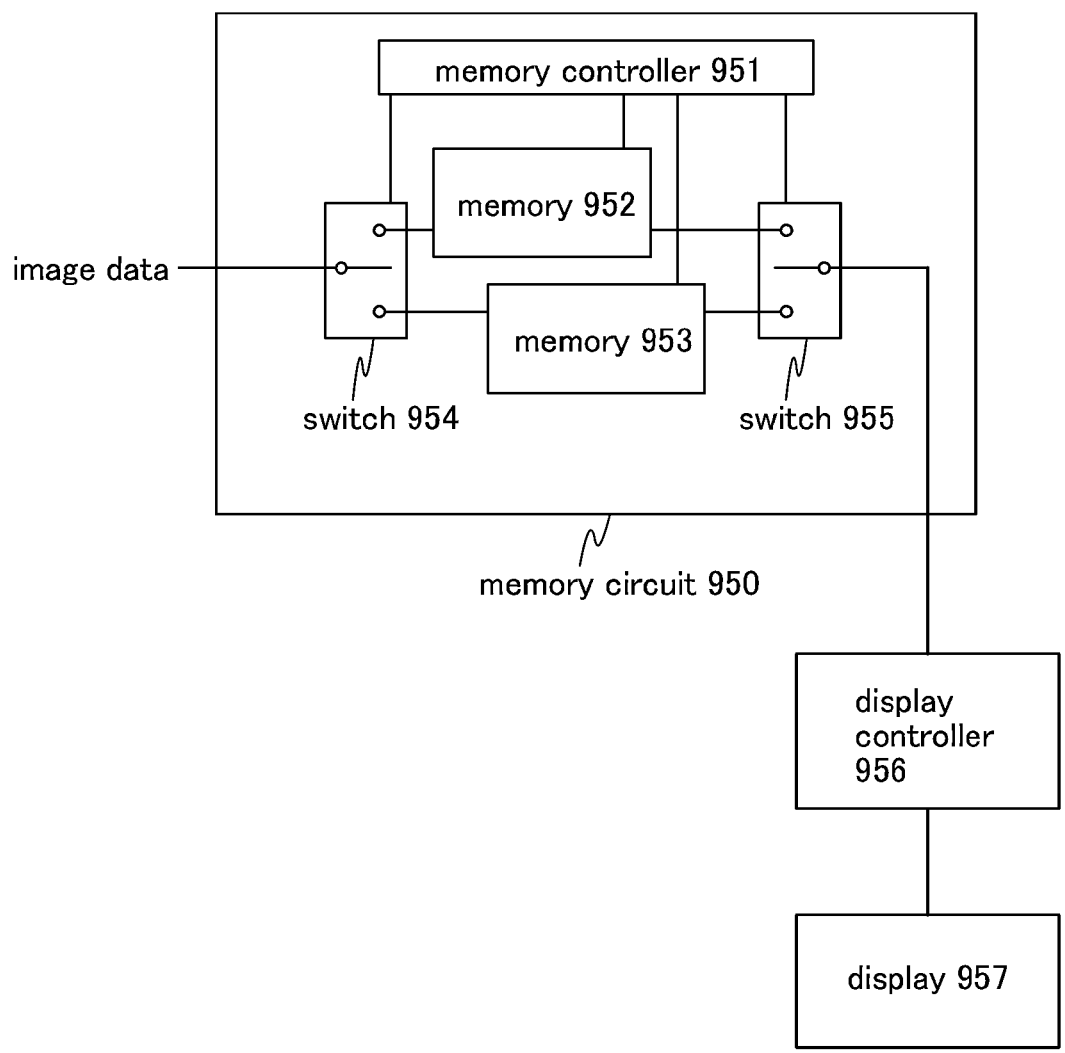
FIG. 9 is a block diagram of one embodiment of a semiconductor device.

Next, FIG. 9 illustrates an example in which the semiconductor device described in any of the above embodiments is used for a memory circuit 950 in a display. The memory circuit 950 illustrated in FIG. 9 includes a memory 952, a memory 953, a switch 954, a switch 955, and a memory controller 951. Further, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not illustrated). The input image data A is stored in the memory 952 though the switch 954. The image data stored in the memory 952 (stored image data A) is transmitted to the display 957 through the switch 955 and the display controller 956, and is displayed on the display 957.

In the case where the input image data A is not changed, the stored image data A is read from the memory 952 through the switch 955 by the display controller 956 with a frequency of about 30 Hz to 60 Hz in general.

Next, for example, when data displayed on the screen is rewritten by a user (that is, in the case where the input image data A is changed), new image data (input image data B) is formed by the application processor. The input image data B is stored in the memory 953 through the switch 954. Also during that time, the stored image data A is read periodically from the memory 952 through the switch 955. After the completion of storing the new image data (the stored image data B) in the memory 953, from the next frame for the display 957, the stored image data B starts to be read, transmitted to the display 957 through the switch 955 and the display controller 956, and is displayed on the display 957. This reading operation is continued until another new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 10:
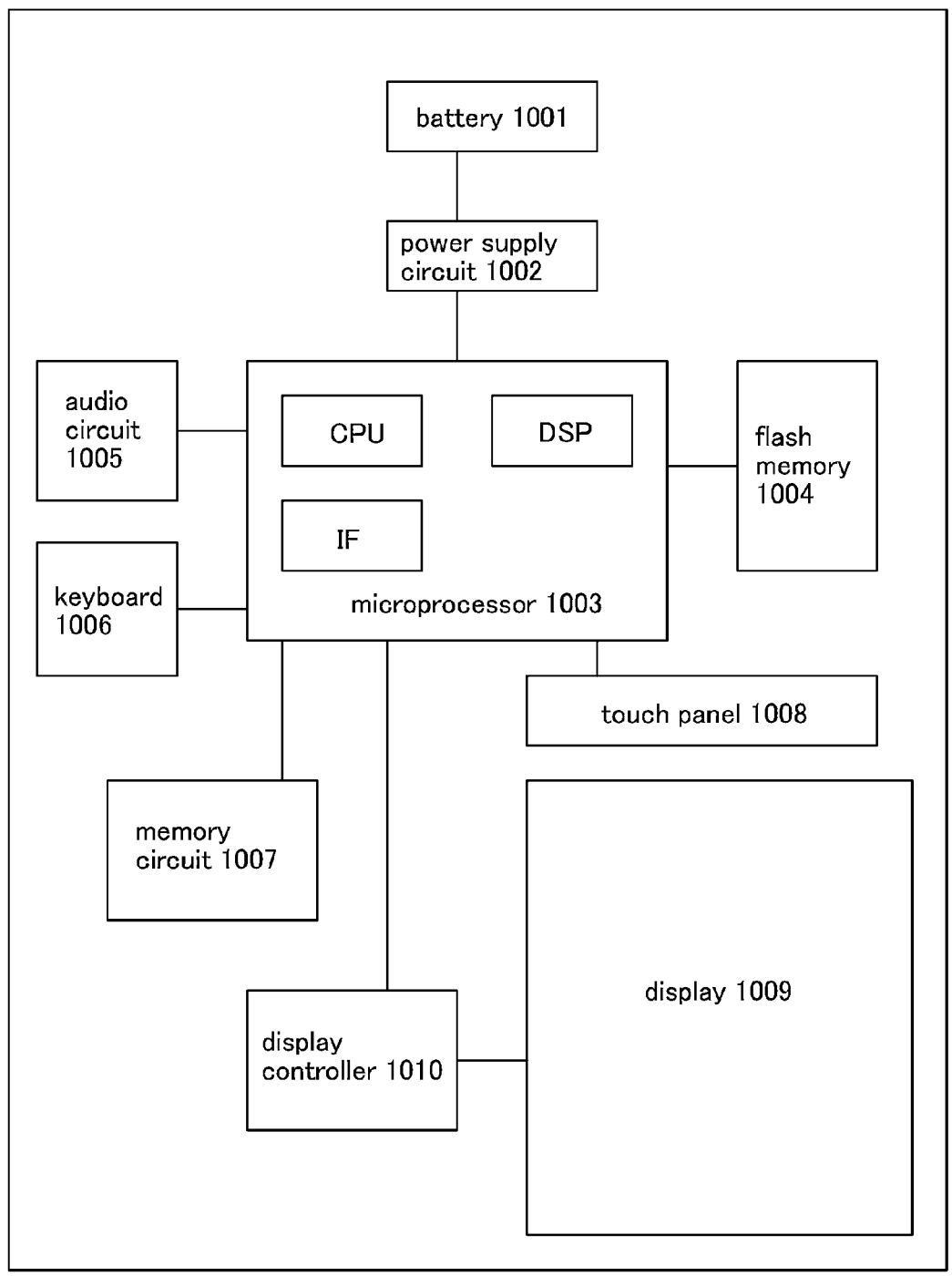
FIG. 10 is a block diagram of one embodiment of a semiconductor device.

FIG. 10 illustrates a block diagram of an e-book reader. FIG. 10 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 10. The memory circuit 1007 has a function of temporarily holding the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. In the function, data of the part specified by the users is stored and held. In order to save data for a long time, the data may be copied into the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Thus, a portable device which writes and reads data at high speed, can hold data for a long time, and has low power consumption can be provided.

The structures, methods, and the like described in this embodiment can be combined as appropriate with any of the other structures, methods, and the like described in the other embodiments.

Embodiment 5

A semiconductor device according to one embodiment of the present invention can be used in a variety of electronic devices (including game machines). Examples of electronic devices include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a personal digital assistant, an audio reproducing device, a large-sized game machine such as a pachinko machine, and the like. Examples of electronic devices each including the semiconductor device described in any of the above embodiments are described.

Figure 11A:
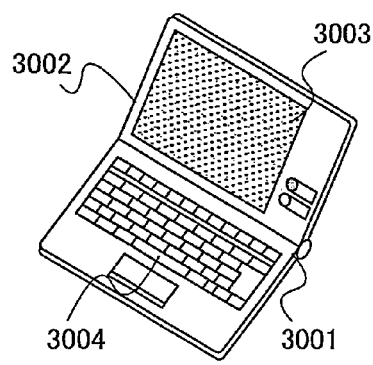
FIGS. 11A to 11F are diagrams of electronic devices.

FIG. 11A illustrates a laptop personal computer, which includes a main body 3001, a housing 3002, a display portion 3003, a keyboard 3004, and the like. The transistor described in any of the above embodiments can be used for the display portion 3003. Although not illustrated, a memory device according to any of the above embodiments can be used as an arithmetic circuit, a wireless circuit, or a memory circuit in the main body. With the use of the semiconductor device according to any of the above embodiments, the laptop personal computer can write and read data at high speed, hold data for a long time, and have low power consumption.

Figure 11B:
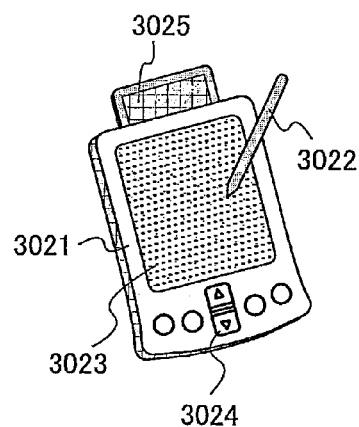

FIG. 11B is a personal digital assistant (PDA), which includes a main body 3021 provided with a display portion 3023, an external interface 3025, operation buttons 3024, and the like. A stylus 3022 is included as an accessory for operation. The transistor described in any of the above embodiments can be used for the display portion 3023. Although not illustrated, a memory device according to any of the above embodiments can be used as an arithmetic circuit, a wireless circuit, or a memory circuit in the main body. With the use of the semiconductor device according to any of the above embodiments, the personal digital assistant (PDA) can write and read data at high speed, hold data for a long time, and have low power consumption.

Figure 11C:
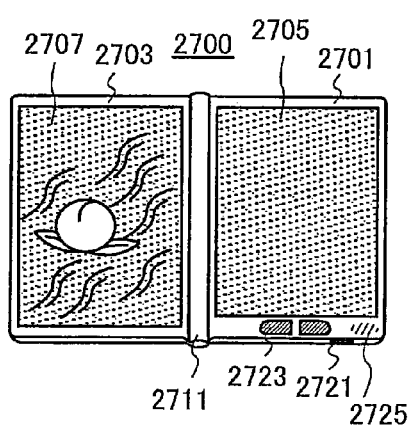

FIG. 11C illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed on different display portions, for example, the right display portion (the display portion 2705 in FIG. 11C) can display text and the left display portion (the display portion 2707 in FIG. 11C) can display graphics. The transistor described in any of the above embodiments can be used for the display portion 2705 and the display portion 2707. Although not illustrated, a memory device according to any of the above embodiments can be used as an arithmetic circuit, a wireless circuit, or a memory circuit in a main body of the e-book reader 2700. With the use of the semiconductor device according to any of the above embodiments, the e-book reader 2700 can write and read data at high speed, hold data for a long time, and have low power consumption.

FIG. 11C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on a surface of the housing, on which the display portion is provided. Further, an external connection terminal (an earphone terminal, a USB terminal, or the like), a recording medium insertion portion, and the like may be provided on the back surface or a side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Figure 11D:
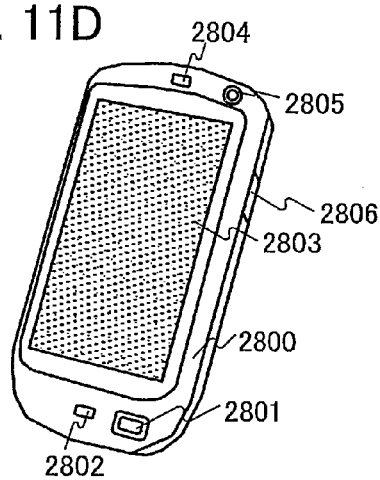

FIG. 11D illustrates a smartphone, which includes a housing 2800, a button 2801, a microphone 2802, a display portion 2803 provided with a touch panel, a speaker 2804, and a camera lens 2805 and functions as a mobile phone. The transistor described in any of the above embodiments can be used for the display portion 2803. Although not illustrated, a memory device according to any of the above embodiments can be used as an arithmetic circuit, a wireless circuit, or a memory circuit in a main body of the smartphone. With the use of the semiconductor device according to any of the above embodiments, a mobile phone capable of writing and reading data at high speed, holding data for a long time, and having low power consumption can be provided.

The display direction of the display portion 2803 can be changed depending on a usage pattern. Since the camera lens 2805 is provided on the same plane as the display portion 2803, videophone is possible. The speaker 2804 and the microphone 2802 can be used for videophone calls, recording and playing sound, and the like as well as voice calls.

An external connection terminal 2806 can be connected to an AC adapter and various types of cables such as a USB cable, and charging and data communication with a personal computer are possible. Further, a large amount of data can be stored and moved by inserting a storage medium into the external memory slot (not illustrated).

In addition to the above functions, an infrared communication function, a television reception function, or the like may be provided.

Figure 11E:
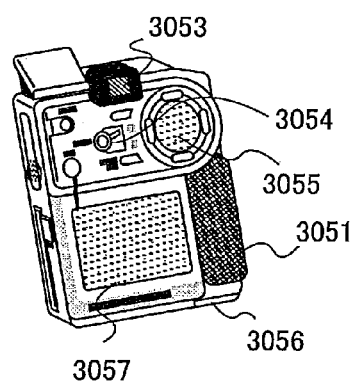

FIG. 11E illustrates a digital video camera, which includes a main body 3051, a display portion A 3057, an eyepiece portion 3053, an operation switch 3054, a display portion B 3055, a battery 3056, and the like. The transistor described in any of the above embodiments can be used for the display portion A 3057 and the display portion B 3055. Although not illustrated, a memory device according to any of the above embodiments can be used as an arithmetic circuit, a wireless circuit, or a memory circuit in the main body. With the use of the semiconductor device according to any of the above embodiments, the digital video camera can write and read data at high speed, hold data for a long time, and have low power consumption.

Figure 11F:
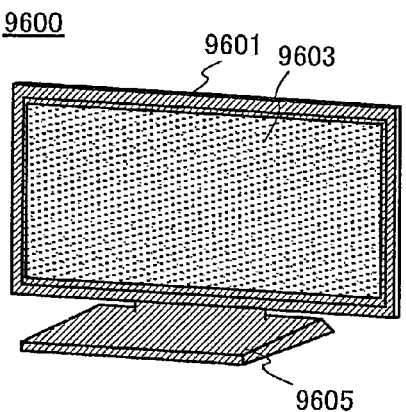

FIG. 11F illustrates an example of a television set. In a television set 9600, a display portion 9603 is incorporated in a housing 9601. The display portion 9603 can display images. Here, the housing 9601 is supported by a stand 9605. The transistor described in any of the above embodiments can be used for the display portion 9603. Although not illustrated, a memory device according to any of the above embodiments can be used as an arithmetic circuit, a wireless circuit, or a memory circuit in a main body of the television set 9600. With the use of the semiconductor device according to any of the above embodiments, the television set 9600 can write and read data at high speed, hold data for a long time, and have low power consumption.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires through the modem, one-way (from a sender to a receiver) or two-way (between a sender and a receiver or between receivers) information communication can be performed.

The structures and methods described in this embodiment can be combined as appropriate with any of the structures and methods described in the other embodiments.

This application is based on Japanese Patent Application serial No. 2011-226229 filed with Japan Patent Office on Oct. 13, 2011, the entire contents of which are hereby incorporated by reference.

What is claimed is:
1. A semiconductor device comprising:
a substrate;
an oxide semiconductor film over the substrate;
a source electrode layer;
a drain electrode layer;
a first gate insulating film in contact with the source electrode layer and the drain electrode layer; and
a first gate electrode layer over the oxide semiconductor film with the first gate insulating film therebetween,
wherein the first gate electrode layer is located in a depressed portion between the source electrode layer and the drain electrode layer,
wherein the oxide semiconductor film does not overlap with the source electrode layer and the drain electrode layer,
wherein the first gate electrode layer does not overlap with the source electrode layer and the drain electrode layer,
wherein a side surface of the oxide semiconductor film is in contact with the source electrode layer,
wherein an opposite side surface of the oxide semiconductor film is in contact with the drain electrode layer,
wherein a thickness of the source electrode layer is larger than a thickness of the oxide semiconductor film, and
wherein a thickness of the drain electrode layer is larger than the thickness of the oxide semiconductor film.

2. The semiconductor device according to claim 1, wherein a thickness of the first gate insulating film is greater than or equal to 1 nm and less than or equal to 20 nm.

3. The semiconductor device according to claim 1, further comprising a transistor below the oxide semiconductor film, wherein the transistor comprises:
a channel formation region;
a second gate insulating film over the channel formation region; and
a second gate electrode layer over the second gate insulating film,
wherein the second gate electrode layer is in contact with the source electrode layer.

4. The semiconductor device according to claim 3, wherein the channel formation region is included in the substrate.

5. The semiconductor device according to claim 3, further comprising a conductive film overlapping with the source electrode layer with the first gate insulating film therebetween.

6. The semiconductor device according to claim 3, wherein the transistor further comprises a pair of impurity regions, and
wherein the channel formation region is sandwiched between the pair of impurity regions.

7. The semiconductor device according to claim 1, wherein the thickness of the oxide semiconductor film is greater than or equal to 3 nm and less than or equal to 30 nm.

8. The semiconductor device according to claim 1, wherein the oxide semiconductor film is a c-axis aligned crystalline oxide semiconductor film.

9. The semiconductor device according to claim 1, wherein the side surface of the oxide semiconductor film coincides with a side surface of the first gate insulating film.

10. A semiconductor device comprising:
a substrate;
a semiconductor film over the substrate, the semiconductor film comprising a first side surface and a second side surface;
a source electrode layer and a drain electrode layer respectively in contact with the first side surface and the second side surface;
a first gate insulating film over the source electrode layer, the drain electrode layer, and the semiconductor film; and
a first gate electrode layer over the semiconductor film with the first gate insulating film therebetween,
wherein an entire top surface of the semiconductor film is in contact with the first gate insulating film,
wherein top surfaces of the source electrode layer and the drain electrode layer are higher than a top surface of the semiconductor film, and
wherein the first gate electrode layer fills a depressed portion over the semiconductor film and between the source electrode layer and the drain electrode layer.

11. The semiconductor device according to claim 10, further comprising a transistor below the semiconductor film, wherein the transistor comprises:
a channel formation region;
a second gate insulating film over the channel formation region; and
a second gate electrode layer over the second gate insulating film,
wherein the second gate electrode layer is in contact with the source electrode layer.

12. The semiconductor device according to claim 11, wherein the channel formation region is included in the substrate.

13. The semiconductor device according to claim 10, wherein the semiconductor film is an oxide semiconductor film.

14. The semiconductor device according to claim 10, wherein the semiconductor film is a c-axis aligned crystalline oxide semiconductor film.

15. A semiconductor device comprising:
a substrate;
a semiconductor film over the substrate, the semiconductor film comprising a first side surface and a second side surface;
a source electrode layer and a drain electrode layer respectively in contact with the first side surface and the second side surface;
a first gate insulating film over the source electrode layer, the drain electrode layer, and the semiconductor film; and
a first gate electrode layer over the semiconductor film with the first gate insulating film therebetween,
wherein the semiconductor film does not overlap with the source electrode layer and the drain electrode layer,
wherein the first gate electrode layer does not overlap with the source electrode layer and the drain electrode layer,
wherein top surfaces of the source electrode layer and the drain electrode layer are higher than a top surface of the semiconductor film,
wherein the first gate electrode layer fills a depressed portion over the semiconductor film and between the source electrode layer and the drain electrode layer, and
wherein a top surface of the first gate electrode layer is aligned with a top surface of the first gate insulating film formed over the source electrode layer or the drain electrode layer.

16. The semiconductor device according to claim 15, further comprising a transistor below the semiconductor film, wherein the transistor comprises:
a channel formation region;
a second gate insulating film over the channel formation region; and
a second gate electrode layer over the second gate insulating film,
wherein the second gate electrode layer is in contact with the source electrode layer.

17. The semiconductor device according to claim 16, wherein the channel formation region is included in the substrate.

18. The semiconductor device according to claim 15, wherein the semiconductor film is an oxide semiconductor film.

19. The semiconductor device according to claim 15, wherein the semiconductor film is a c-axis aligned crystalline oxide semiconductor film.

* * * * *

UNITED STATES PATENT AND TRADEMARK OFFICE
CERTIFICATE OF CORRECTION

PATENT NO.         : 9,117,916 B2
APPLICATION NO.    : 13/646086
DATED              : August 25, 2015
INVENTOR(S)        : Takehisa Hatano et al.

It is certified that error appears in the above-identified patent and that said Letters Patent is hereby corrected as shown below:

In the specification

At column 6, lines 8-9, "85≤ to 95≤" should be --85° to 95°--;

At column 6, line 54, "$1/10^6$ Σm" should be --$1 \times 10^6$ μm--;

At column 6, line 55, "10 Σm," should be --10 μm,--;

At column 6, line 59, "$1/10^{å13}$ A." should be --$1 \times 10^{-13}$ A.--;

At column 6, line 62, "100 zAa Σm." should be --100 zA/μm.--;

At column 8, line 10, "(α?0)." should be --(α > 0).--;

At column 8, [Formula 1],

" $$Ra > \frac{1}{S_0} \int_{y_1}^{y_2} \int_{x_1}^{x_2} | f(x,y) \, å \, Z_0 \, |dxdy$$ "

should be

-- $$Ra = \frac{1}{S_0} \int_{y_1}^{y_2} \int_{x_1}^{x_2} | f(x,y) - Z_0 |dxdy$$ --;

At column 9, line 54, "90 &" should be --90 %--;

At column 9, line 55, "100 &," should be --100 %,--;

At column 9, line 55, "95 &" should be --95 %--;

At column 9, line 56, "99.9 &." should be --99.9 %.--;

At column 10, line 38, "In: Ga:Zn>1:1:1 (>1/3:1/3:1/3)," should be --In: Ga: Zn = 1:1:1 (= 1/3:1/3:1/3),--;

At column 10, lines 38-39, "In:Ga:Zn>2:2:1 (>2/5:2/5:1/5)," should be --In: Ga: Zn = 2:2:1 (= 2/5:2/5:1/5),--;

Signed and Sealed this
First Day of March, 2016

Michelle K. Lee
*Director of the United States Patent and Trademark Office*

CERTIFICATE OF CORRECTION (continued)
U.S. Pat. No. 9,117,916 B2

In the specification

At column 10, line 39, "In:Ga:Zn>3:1:2 (>1/2:1/6:1/3)," should be --In: Ga: Zn = 3:1:2 (= 1/2:1/6:1/3),--;

At column 10, line 42, "In:S n:Zn>1:1:1 (>1/3:1/3:1/3)," should be --In: S n: Zn = 1:1:1 (= 1/3:1/3:1/3),--;

At column 10, line 43, "In:S n:Zn>2:1:3 (>1/3:1/6:1/2)," should be --In: S n: Zn = 2:1:3 (= 1/3:1/6:1/2),--;

At column 10, lines 43-44, "In:S n:Zn>2:1:5 (>1/4:1/8:5/8)," should be --In: S n: Zn = 2:1:5 (= 1/4:1/8:5/8),--;

At column 10, line 61, "In:Ga:Zn>a:b:c (a, b, c>1)," should be --In: Ga: Zn = a:b:c (a + b + c = 1),--;

At column 10, line 63, "In:Ga:Zn>A:B:C (A,B,C>1)" should be --In: Ga: Zn = A:B:C (A + B + C = 1)--;

At column 10, line 64, "(a å A)$^2$, (b å B)$^2$, (c å C)$^2$." should be --(a - A)$^2$ + (b - B)$^2$ + (c - C)$^2$--;

At column 11, line 11, "250≤C" should be --250 °C--;

At column 11, line 12, "700≤C," should be --700 °C,--;

At column 11, line 12, "400≤C," should be --400 °C,--;

At column 11, line 13, "500≤C," should be --500 °C,--;

At column 11, line 14, "550≤C." should be --550 °C.--;

At column 11, line 21, "200≤C" should be --200 °C--;

At column 11, line 21, "450≤C;" should be --450 °C;--;

At column 11, line 29, "200≤C" should be --200 °C--;

At column 11, line 29, "700≤C;" should be --700 °C;--;

At column 11, line 37, "200≤C" should be --200 °C--;

At column 11, line 37, "700≤C," should be --700 °C,--;

At column 11, line 47, "300≤C" should be --300 °C--;

At column 11, line 48, "700≤C," should be --700 °C,--;

At column 11, line 56, "5/10$^{19}$/cm$^3$," should be --5 × 10$^{19}$/cm$^3$,--;

At column 11, line 57, "5/10$^{18}$/cm$^3$." should be --5 × 10$^{18}$/cm$^3$.--;

At column 12, line 13, "99.9999 &)," should be --99.9999 %),--;

At column 12, line 14, "99.99999 &)" should be --99.99999 %)--;

At column 12, line 20, "20 ppm (å55≤C" should be --20 ppm (-55 °C--;

At column 15, line 31, "(x?0, y?0))," should be --(x > 0, y > 0)),--;

In the specification

CERTIFICATE OF CORRECTION (continued)
U.S. Pat. No. 9,117,916 B2

At column 15, line 32, "(x?0, y?0))," should be --(x > 0, y > 0)),--;

At column 15, line 33, "(x?0, y?0))," should be --(x > 0, y > 0)),--;

At column 15, line 62, "300≤C" should be --300 °C--;

At column 15, line 63, "450≤C." should be --450 °C.--;

At column 22, line 38, "$V_{th'H}$" should be --$V_{th\_H}$--;

At column 22, line 40, "$V_{th'L}$" should be --$V_{th\_L}$--;

At column 22, line 45, "$V_{th'H}$ and $V_{th'L}$," should be --$V_{th\_H}$ and $V_{th\_L}$,--;

At column 22, line 49, "(? $V_{th'H}$)," should be --(> $V_{th\_H}$),--;

At column 22, line 52, "(<$V_{th'L}$)," should be --(< $V_{th\_L}$),--;

At column 22, line 59, "$V_{th'H}$" should be --$V_{th\_H}$--;

At column 22, line 62, "$V_{th'L}$" should be --$V_{th\_L}$--;

At column 24, line 8, "$(C_B/V_{B0}, C/V)/(C_B,C)$," should be --$(C_B \times V_{B0} + C \times V) / (C_B+C)$,--;

At column 24, line 16, "$V_0$ ($V_1$?$V_0$)," should be --$V_o$ ($V_1 > V_0$),--;

At column 24, line 17, "$V_1$ (>$(C_B/V_{B0},C/V_1)/(C_B,C)$)" should be --$V_1$ (=$(C_B \times V_{B0} + C \times V_1) / (C_B+C)$)--; and At column 24, line 19, "$V_0$ ($C_B/V_{B0},C/V_0)/(C_B,C)$)." should be --$V_0$ (=$(C_B \times V_{B0} + C \times V_o) / (C_B +C)$)--.